United States Patent [19]

Spigarelli et al.

[11] Patent Number: 5,627,913
[45] Date of Patent: May 6, 1997

[54] PLACEMENT SYSTEM USING A SPLIT IMAGING SYSTEM COAXIALLY COUPLED TO A COMPONENT PICKUP MEANS

[75] Inventors: Donald J. Spigarelli, Groton, Mass.; John M. DeCarlo, York, Me.; Ernest LaFleur, Lunenberg, Mass.; Bryan R. Pinette, Derry, N.H.

[73] Assignee: Sierra Research and Technology, Inc., Westford, Mass.

[21] Appl. No.: 592,599

[22] Filed: Jan. 26, 1996

Related U.S. Application Data

[63] Continuation of Ser. No. 113,771, Aug. 27, 1993, abandoned, which is a continuation-in-part of Ser. No. 873,581, Apr. 21, 1992, Pat. No. 5,251,266, which is a continuation of Ser. No. 573,459, Aug. 27, 1990, abandoned.

[51] Int. Cl.[6] .................................................. G06K 9/00
[52] U.S. Cl. ........................................... 382/151; 348/87
[58] Field of Search ..................................... 382/146, 151, 382/294, 295; 395/155, 161; 348/87; 29/740

[56] References Cited

U.S. PATENT DOCUMENTS

| | | | |
|---|---|---|---|
| 2,803,755 | 8/1957 | Milford | 250/230 |
| 4,073,424 | 2/1978 | Kulicke, Jr. et al. | 228/4.5 |
| 4,103,814 | 8/1978 | Nishioka | 228/6 A |
| 4,116,376 | 9/1978 | DeLorme et al. | 228/170 |
| 4,422,568 | 12/1983 | Elles et al. | 228/111 |
| 4,426,571 | 1/1984 | Beck | 219/373 |
| 4,568,972 | 2/1986 | Arents | 358/108 |
| 4,620,659 | 11/1986 | Holdway | 228/20 |
| 4,628,464 | 12/1986 | McConnell | 364/513 |
| 4,659,004 | 4/1987 | Fridman | 228/6.2 |
| 4,737,845 | 4/1988 | Susuki et al. | 358/101 |
| 4,794,647 | 12/1988 | Forgues et al. | 382/8 |
| 4,821,393 | 4/1989 | Spigarelli | 29/283 |
| 4,832,250 | 5/1989 | Spigarelli et al. | 228/102 |
| 4,914,513 | 4/1990 | Spigarelli et al. | 358/101 |
| 5,109,479 | 4/1992 | Williams | 395/125 |
| 5,113,565 | 5/1992 | Cipolla et al. | 29/25.01 |
| 5,189,707 | 2/1993 | Suzuki et al. | 382/8 |
| 5,251,266 | 10/1993 | Spigarelli et al. | 382/8 |

OTHER PUBLICATIONS

IBM Technical Disclosure Bulletin "Optical Inspection/Alignment of Multisided Component Connections"., Sep., 1987, vol. 30 No. 4, pp. 1506–1508.

*Primary Examiner*—Andrew Johns
*Attorney, Agent, or Firm*—Weingarten, Schurgin, Gagnebin & Hayes LLP

[57] ABSTRACT

A placement apparatus for placing and mounting circuit components or devices in aligned combination with circuit boards. The apparatus includes an imaging system, a first stage moveable in first and second opposite directions between first and second predetermined positions, for positioning the circuit board onto which the component is to be placed within a field of view of the imaging system. A second stage, for holding the circuit component, is movably coupled to the first stage. The apparatus further includes a component pick-up system disposed about the first stage for picking up the circuit component from the second stage and placing the circuit component in a predetermined position on the first stage. The imaging system is coupled to a graphical user interface system for providing a position indicator on a monitor screen, wherein the position indicator identifies the location of a particular feature of the circuit board or the circuit component.

14 Claims, 11 Drawing Sheets

PLACEMENT SYSTEM USING A SPLIT IMAGING SYSTEM COAXIALLY COUPLED TO A COMPONENT PICKUP MEANS

This application is a continuation of application Ser. No. 08/113,771 filed Aug. 27, 1993, now abandoned, which is a Continuation-in-part of Ser. No. 07/873,581 filed Apr. 21, 1992, now U.S. Pat. No. 5,251,266, which is a Continuation of Ser. No. 07/573,459 filed Aug. 27, 1990, now abandoned.

FIELD OF THE INVENTION

The present invention relates generally to apparatus for mounting components on printed circuit boards, and more particularly, to a guidance type placement apparatus that provides active lead-to-pad matching for mounting integrated circuit devices on printed circuit boards.

BACKGROUND OF THE INVENTION

Advances in integrated circuit architecture and miniaturization have resulted in greater numbers of functions being encompassed on single chips, necessitating the use of chips of larger dimensions, increased lead density and/or reduced lead pitch. The increasing use of fine pitch integrated circuit devices (FPD), which presently have lead pitches on the order of 0.012 inches, and the projected use of FPDs having lead pitches on the order of 0.008 inches, has taxed the placement capabilities of existing integrated circuit placement systems.

The continuing reduction in lead pitch dimensions has a corresponding effect on placement error tolerances. Placement error is a function of angular error, translational error, and geometric differences between the FPDs and the circuit board. Translational error is the X, Y offset of an FPD from a specified circuit board placement site and is primarily related to lead pitch. Angular error is the rotational difference between the specified circuit board placement site and the actual site and is related to both lead pitch and the size of the FPD.

For rotation of a FPD about its center, there is an apparent offset of the leads relative to the board pads, with the misalignment being most severe at the corners. For example, rotation of a 1.5 inch FPD about 0.15° with respect to its center causes a lateral offset of about 2 mils for a corner lead. Misalignment problems in FPDs, in conjunction with lead-to-pad overlap requirements, place stringent requirements on component placement systems.

A conventional means of component placement and alignment is the "ballistic" placement system exemplarily illustrated in FIGS. 1A–1C which comprises a vision subsystem that includes two cameras C1, C2 and a mechanical positioning subsystem MPS that provides for X, Y positioning of a movable placement head MPH and Z, Θ movement of a component tool CT mounted on the placement head. In the ballistic system, a component is retrieved by moving the placement head MPH to a feed location, picking up the component, and analyzing the component image in the vision subsystem utilizing the field-of-view of a first camera C1 as illustrated in FIG. 1A. The location and magnification of the first camera C1, the position of the placement head MPH, and the location of the component in field-of-view of the vision subsystem are factors determinative of the position of the component with respect to a datum point of the system.

The placement head MPH is then moved to the target site on the circuit board and the second camera C2 is used to make measurements on either the board mounting pads or fiducial references on the board as illustrated in FIG 1B. Determination of the board position is also subject to the foregoing factors. Translational and rotational corrections are calculated based upon board and component positions, and these corrections are applied by the system in placing the component on the board as illustrated in FIG. 1C.

There are several inherent limitations in ballistic systems that make them less effective for FPD placement and alignment. Component mounting is based upon the combined absolute accuracy of the vision subsystem and the mechanical positioning subsystem throughout the working envelope of the system. Vision is not utilized for final lead-to-pad alignment and placement. Ensuring proper lead-to-pad alignment with the accuracy demanded by IC devices such as FPDs requires simultaneous observation of the lead-to-pad alignment on each of the four sides of the FPD during placement operations. The conventional ballistic placement system described hereinabove and illustrated in FIGS. 1A–1C has a configuration that does not facilitate utilization of the vision subsystem during the actual placement operations.

In addition, the magnification of both cameras must be known and maintained with great accuracy in a ballistic placement system the location of the cameras on the system must be known with a high degree of accuracy. If fiducials are utilized as board references, the relationship between fiducials and the board mounting pads must be specified and maintained on a site to site basis.

The mechanical positioning subsystem must be capable of accurate movement to position the workpieces with respect to the vision subsystem and with respect to each other. Generally, achievement of the requisite degree of absolute movement accuracy in a ballistic type placement system requires precision components and/or frequent calibration, both options increasing the expense of such a system.

The impact of these limitations may be minimized by design and calibration, but with a corresponding cost impact. Minimizing these limitations by design results in disproportionately higher equipment costs, and correction by calibration entails increased operating costs and inconvenience.

Traditional ballistic placement systems, even with vision enhancement, generally do not achieve the accuracy required for the placement and alignment of FPDs on printed circuit boards. In addition, traditional ballistic placement systems generally do not have an inherent capability, and are not easily modified, for on-head soldering or soldering-in-place to secure aligned FPDs to printed circuit boards.

Typically, bonding may be accomplished by any of several methods such as reflow soldering. The board may be transported off the placement system for bonding such as to a mass reflow machine. Alternatively, selective reflow techniques may be utilized to reflow solder the component prior to transporting the board off the placement system. Or, the component may be reflow bonded at the time of placement with equipment mounted integral to the system.

For FPDs, the third alternative is generally the most advantageous. As discussed above, misalignment is a critical consideration in placing and aligning FPDs on circuit boards. Misalignment may occur when a component is released after being placed and aligned, and/or when the circuit board is subjected to further handling. Reflowing to bond the component to the circuit board while the component is being held in place by the placement apparatus significantly reduces or eliminates lead-to-pad misalignment problems. However, the placement head configuration of typical ballistic placement systems is not conducive to the integration and/or utilization of an integral heater array subsystem.

SUMMARY OF THE INVENTION

A guidance type placement apparatus according to the present invention overcomes the inherent limitations of the prior art as discussed hereinabove, and provides a marked improvement in accuracy for lead-to-pad matching of IC devices to circuit boards. In addition, the placement apparatus of the present invention provides the capability to effect bonding operations with the IC device maintained in placed alignment by the placement apparatus. The placement apparatus provides active lead-to-pad alignment during placement and reflow bonding of IC devices, and especially fine pitch IC devices (FPDs) having finer lead pitch and/or higher lead counts than conventional IC devices. The apparatus provides more consistent performance with lower equipment and maintenance costs, and provides immediate feedback and control during the placement process for a more reliable and predictable process.

The guidance type placement apparatus includes a mechanical positioning subsystem, an image acquisition/processing subsystem, a master control subsystem, and optionally, a heater array subsystem. The mechanical positioning subsystem is sequentially operative to position the circuit board and IC device for the generation of images thereof, to align the IC device with a designated placement site on the board, and to mount the IC device in aligned combination with the board. The image acquisition subsystem is operative to generate images of at least one pair of diagonally opposed corners of the placement site and IC device from the same optical perspective. Images generated by the image acquisition subsystem provide feedback control to regulate the placement process to attain and verify lead-to-pad alignment. The heater array subsystem is utilized to bond the IC device to the circuit board while the mechanical positioning subsystem maintains the IC device in aligned combination with the board.

One embodiment of the guidance type placement apparatus includes an apparatus infrastructure, a movable X-Y table, a fixed placement head, and a master control subsystem. Another embodiment utilizes an X-Y movable placement head and a fixed placement platform. Yet another embodiment utilizes a movable placement head and a movable placement platform, one being movable in the X-direction and the other being movable in the Y-direction. The placement head includes a component pickup subsystem and an image acquisition subsystem. The placement head may also include a concentrically mounted heater array subsystem.

The movable X-Y table is operative for movement in the X and Y directions to sequentially position selected work areas beneath the fixed placement head for placement and reflow operations. The X-Y table includes means for detachably securing a printed circuit board in combination therewith at a known location, and a matrix tray for holding IC devices to be mounted on the circuit board at known locations. Alternatively, a mechanical shuttle may be used to feed an IC device directly to the fixed placement head during placement operations.

The fixed placement head is mounted on the apparatus infrastructure and provides a fixed point of reference for placement and reflow operations. The placement head includes the component pickup subsystem which is concentrically disposed with respect to the central axis of the placement head. The pickup subsystem is operative to pickup the IC device to be mounted, rotationally orientate the IC device for placement, and to place the device in aligned position with the placement site of the circuit board. The pickup subsystem may also be utilized to hold the IC device in aligned position on the circuit board during bonding.

The component pickup subsystem includes a vacuum pickup tube that is disposed coaxially with the central axis. The pickup tube is linearly movable in the Z-direction and rotatable about the central axis to pickup, orientate and place the IC device.

The image acquisition subsystem is disposed in combination with the fixed placement head and is configured for simultaneous use in conjunction with the component pickup system. The image generation subsystem is operative to generate images of diagonally opposed corners of the workpieces from the same optical perspective. These images are utilized during the placement operation for initial lead-to-pad matching during coarse alignment, and may be used to provide feedback control for active lead-to-pad matching during final alignment. The image generation subsystem may also be utilized to verify lead-to-pad alignment prior to and following reflow soldering operations.

The image generation subsystem is operative to provide images of diagonally opposed corners of the placement site, the IC device, and the superposed combination of the IC device and the placement site. One embodiment of the image generation subsystem includes a concentrically mounted reflecting member, an adjustable, split reflecting member, and an image receiving means. This embodiment utilizes overlapping images of the work piece generated by the split reflecting member to provide a superimposed image of diagonally opposed corners of the work piece for lead-to-pad alignment during placement and reflow operations.

Another embodiment of an image generation subsystem includes a single video camera and at least one pair of optical fibers disposed to transmit images of diagonally opposed corners of the work piece to the video camera. Electronic processing is utilized to provide a split screen image of diagonally opposed corners of the work piece for lead-to-pad alignment during placement head to generate images of the workpieces. Still another embodiment of the image acquisition subsystem includes a microscope subsystem annularly disposed within the fixed placement head about the central axis thereof to permit viewing of diagonally opposed corners of the work piece.

The guidance type placement apparatus may also include an illumination subsystem configured and orientated for illuminating the placement and reflow soldering work areas to enhance observation of the work pieces during placement and reflow operations. The illumination subsystem is positioned so that light therefrom is reflected from the work pieces to the image generation subsystem.

The guidance type placement apparatus is operated under control of the master control subsystem which is preprogrammed with the location of the placement site and IC device to be mounted and a placement protocol that sequentially effects coarse lead-to-pad alignment followed by fine lead-to-pad alignment (when required) and placement. The placement process according to the present invention is insensitive to magnification effect in deriving/applying angular offsets during the coarse alignment process. Magnification effects are irrelevant during the fine alignment process.

To initiate coarse alignment, the X-Y table is moved to concentrically position the placement site of the circuit board over the reference point wherein the image acquisition subsystem is utilized to acquire an image of diagonally opposed corners of the placement site which are used to generate machine coordinates of the image which are stored and correlated to the current location of the X-Y table.

The X-Y table is then moved to concentrically position the IC device over the reference point. The component pickup subsystem is activated for Z-movement to pickup the IC device and move the device to a "near placement" position wherein the device lies in a plane substantially coplanar with the plane of the placement site. Near placement positioning ensures that the acquired images of the IC device and the placement site have comparable magnifications. Near placement positioning also compensates for any Z-movement runout caused by operation of the component pickup subsystem.

The image acquisition subsystem is utilized to acquire a "near placement" image of diagonally opposed corners of the IC device that are used to generate machine coordinates for the image. Any angular offset between the IC device and the placement site is derived by correlating the respective machine coordinates. The component pickup subsystem is activated for Θ movement to apply the derived angular offset to the IC device. The steps of IC device image acquisition, derivation of angular offset, and correction for angular offset may be reiterated as necessary to achieve the desired degree of angular alignment.

The X, Y offsets between the IC device and the placement site are then derived by utilizing the respective image information and machine coordinates. The X-Y table is then moved to reposition the placement site over the reference point such that the IC device is superposed in the "near placement" position above the placement site. The component pickup subsystem may be concomitantly activated as necessary for Z-movement to raise/lower the IC device to ensure that the IC device clears the circuit board and/or components thereon during movement of the X-Y table. The X-Y table is then moved to apply the derived X, Y offsets to linearly align the IC device with the placement site.

The placement protocol includes an option that allows fine alignment to be implemented on a site-by-site basis. The placement protocol option may include flags that identify specific placement sites/IC devices where fine alignment must be accomplished. Alternatively, fine alignment may be implemented for quality control of the placement process to ensure that the desired degree of accuracy in lead-to-pad alignment is being achieved.

For fine alignment, the image generation subsystem generates a superposed image of the near placement arrangement which is utilized to determine lead-to-pad offsets at diagonally opposed corners. Commands are issued to generate X-Y table movement and Θ-movement of the pickup tube and placement device, as required, to effect compensating linear and rotational movements for lead-to-pad fine alignment. Iterative corrections are applied as necessary to achieve lead-to-pad alignment with the predetermined degree of accuracy. After final alignment, the pickup tube is moved in the Z-direction to place the IC device in aligned contact with the pads of the placement site.

A heater array subsystem may also be utilized in combination with the fixed placement head so that the placement apparatus may also effect reflow operations with the IC device held in placed alignment by means of the pickup tube. The configuration of the heater array subsystem facilitates concentric mounting of the subsystem in combination with the fixed placement head and interference free operation in conjunction with the component pickup subsystem and the image acquisition subsystem.

One embodiment of the heater array subsystem generates focused infrared (IR) radiation having a heating pattern of linear configuration and minimal width which provides excellent thermal separation for X, Y linearly-orientated bonding sites. The IR heater array subsystem includes four IR subassemblies, opposed pairs of X, Y reflecting members, a frame member, and a base member. Each IR subassembly includes a linear IR lamp for generating IR radiation which is mounted within a lamp envelope that is configured to focus the generated IR radiation into the straight line hearing pattern at the bonding sites.

The focused IR radiation generated by the IR subassemblies is reflected by means of the opposed pairs of X, Y reflecting members into alignment with the X, Y orientated bonding sites. The reflecting members are rotatably mounted in combination within the frame member. The frame member includes radiation slots and movable shields disposed in combination with the radiation slots to permit variations in the heating pattern of the focused IR radiation to accommodate IC devices of varying sizes. The IR subassemblies and frame member are mounted in combination with the base member which is configured for mounting the IR heater array subsystem in combination with the fixed placement head.

Bonding is accomplished while the pickup tube is positioned to maintain the leads of the IC device is aligned combination with the bonding pads of the placement site. The IR subassemblies are activated to generate focused IR radiation having a predetermined power level for a predetermined period of time to effectuate bonding. After reflow, the pickup tube is withdrawn to an unengaged position, and the apparatus is ready to repeat the foregoing described placement and reflow processes.

In accordance with a further aspect of the present invention, a placement system for placing a circuit component on a circuit board includes a viewing system, a first stage, for positioning the circuit board onto which the component is to be placed within the field of view of the viewing system, a second stage, coupled to said first stage, for holding the circuit component, the second stage moveable in first and second different directions, a component pick-up system disposed about the first stage, wherein the component pick-up system is provided for picking up circuit components and wherein the viewing system is coupled to the component pick-up system. The placement system further includes a monitor having a display screen, coupled to the viewing system and a user interface coupled to the monitor, wherein the user interface provides a position indicator on the monitor display screen and wherein the position indicator identifies the location of a particular feature of the circuit board. With this particular arrangement a system for placing circuit components in a designated placement site of a circuit board is provided. The system provides a simple, relatively inexpensive, highly accurate and relatively fast, means of placing fine pitch, very fine pitch and ultra fine pitch circuit components onto a circuit board. The imaging system may be provided as a split image imaging system for fine pitch components and may be co-axially aligned with the component pickup tool which may be provided for example as a vacuum tube. The pickup tool is actuated in the Z (up/down) direction. No other movement is required of the fixed head. The viewing system provides an image on the monitor display screen. In operation, the first stage moves to a first predetermined position and places the circuit board within the field of view of the viewing system. The site onto which a component is to be placed is aligned approximately, such that the image of the site is shown on the monitor screen. Using the user interface system, a plurality of position indicators are sequentially located on a feature of the placement site. Each position indicator may be individually and independently moved by means of a graphical user interface (e.g. a mouse or a track-ball) until it is positioned correctly by the operator. The mouse is then "clicked", leaving a stationary position indicator on the screen of the video monitor. The process is then repeated such that a plurality of stationary position indicators are generated on the video screen, each representing a particular feature of the placement site. The second stage corresponding to a component alignment stage is then moved within the field of view of the viewing system. The plurality of position indicators generated during the placement site alignment remain on the video monitor screen. Particular features of the circuit component are now aligned with the plurality of position indicators. When the component features are correctly aligned to the position indicators, the pickup of the "fixed head" lowers and picks up the component. The circuit board is then returned to its initial position designated in the placement cite alignment step. Since this is the position in which the position indicators were first generated and since the circuit component features were also aligned to the same position indicator pattern, the circuit component is thus aligned to the placement site. The component is now placed by the pickup onto the placement site.

BRIEF DESCRIPTION OF THE DRAWINGS

A more complete understanding of the present invention and the attendant advantages and features thereof will be more readily understood by reference to the following detailed description when considered in conjunction with the accompanying drawings wherein.

DETAILED DESCRIPTION OF PREFERRED EMBODIMENTS

Figure 1A:
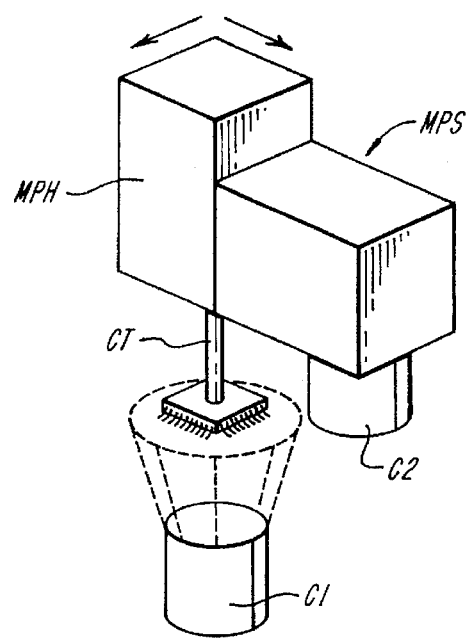
FIGS. 1A–1C are a series of perspective views illustrating the components and operation of a prior art ballistic type placement apparatus.
Figure 1B:
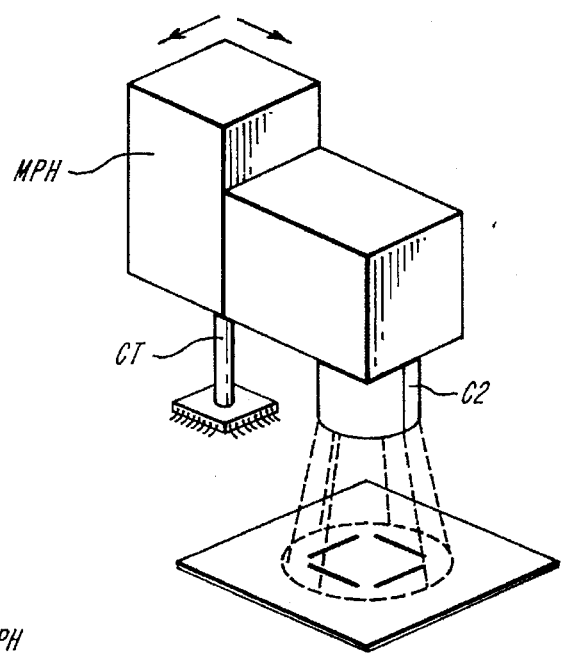
Figure 1C:
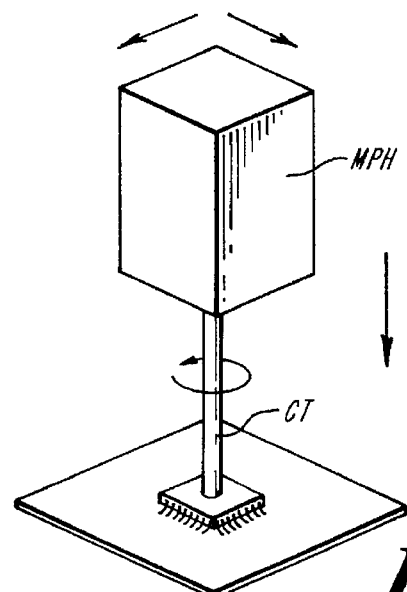

Referring now to the drawings wherein like reference numerals designate corresponding or similar elements throughout the several views. FIGS. 2–10 illustrates a guidance-type placement apparatus 10 for placing and mounting integrated circuit (IC) devices, especially fine pitch IC devices (FPDs), in aligned combination with a printed circuit board. The inventors have determined that a guidance-type placement apparatus 10 as described hereinbelow is an efficient and cost effective means to achieve the requisite accuracy in placing and mounting FPDs on circuit boards. The apparatus 10 generates images of the IC device and/or the circuit board from the same optical perspective to provide active lead-to-pad alignment during placement. The apparatus 10 may also be configured to provide bonding, such as reflow soldering of the IC device, especially of FPDs having finer lead pitch and/or higher lead counts than conventional IC devices, to the printed circuit board while the placement apparatus 10 maintains the IC device in aligned combination with the circuit board.

The guidance type placement apparatus 10 according to the present invention is sequentially operative to mechanically position the circuit board and the IC device for the generation of images thereof, to align the IC device with a designated placement site (which may be the bonding pad matrix of fiducials) on the circuit board, and to mount the IC device in aligned combination with the circuit board. Mechanical positioning may be achieved by a guidance type placement apparatus 10 having different operative combinations of a placement head and a placement platform.

For example, the placement apparatus 10 may include a placement head that is movable in the X, Y plane in combination with a stationary placement platform of the type utilized in the ballistic type placement system. In another embodiment the placement apparatus 10 includes a stationary placement head in combination with a placement platform that is movable in the X, Y plane. In yet another embodiment the placement apparatus includes a placement head and a placement platform that are both movable, one providing movement in the X direction and the other providing movement in the Y direction.

The exemplary embodiment of the guidance type placement apparatus 10 according to the present invention described herein is a stationary head embodiment that provides mechanical positioning of the circuit board and IC device by means of a placement platform that is movable in the X, Y plane. The placement apparatus 10 includes a cabinet 11 with a stationary base 12 having disposed thereon a movable X-Y table 20, a fixed placement head 30, and a master control subsystem 60. The components and operation thereof as described hereinbelow for the stationary head embodiment of the placement apparatus 10 are generally relevant to the movable placement head embodiments. Furthermore, the placement apparatus 10 as described and illustrated in further detail hereinbelow is a stand-alone apparatus, but it will be appreciated that the apparatus may be readily modified to operate as a conveyorized, pass-through apparatus.

The movable X-Y table 20 is movable in the X and Y directions to sequentially position selected work areas (the designated placement site and/or the IC device to be mounted) beneath the fixed placement head 30 for placement and bonding operations. The X-Y table illustrated in FIGS. 2 and 3 includes sidewalls 21, a base 22 and a means 23 for translating the X-Y table 20 with respect to the base 22. The base 22 includes mounting points 24 for detachably securing a printed circuit board 15 in combination with the X-Y table 20. The mounting points 24 are known positions with respect to the sidewalls 21 such that the precise position on the X-Y table 20 of the circuit board 15, and the designated placement sites 16 (bonding pad matrix or fiducials) thereof for mounting IC devices, are known parameters.

A matrix tray 25 having component sites 25s may be mounted in combination with the base 22. The component sites 25s hold IC devices such as FPDs to be mounted on the circuit board. The position of the matrix tray 25 and the component sites 25s thereof are known positions with respect to the sidewalls 21 such that the locations of the IC devices to be mounted, as held in the component sites 25s, are known parameters.

Alternatively, in lieu of the matrix tray 25 as described in the preceding paragraph, the IC device to be mounted may be stored in a location separate from the placement apparatus 10 and mechanically delivered, for example by a shuttle, to the placement apparatus 10 during the appropriate step of the placement process, for example, the IC device may be stored in a component exciser wherein the IC device is prepared for mounting, e.g., cutting leads thereof to shape, etc.

The translating means 23 is operative to move the X-Y table 20 independently in the X, Y directions to position either the circuit board or the matrix tray 25 directly below the fixed placement head 30 as described in further detail hereinbelow. The translating means 23 is electrically interconnected to the control subsystem 60 by means of a cable 26 and provides the motive force to move the X-Y table 20 to defined locations under command of the master control subsystem 60. The translating means 23 may also include means for sensing the position of the X-Y table 20 with respect to the stationary base 12 to provide feedback to the master control subsystem 60 to verify the location of the X-Y table 20.

The fixed placement head 30 may be ball slide mounted in combination with the front of the cabinet 11 of the placement apparatus 10 and has a central axis CA orientated in the Z direction. An extension of the central axis CA in the downward Z direction (towards the base 12) defines a reference point 14 (X, Y coordinates) on the base 12. The placement head 30 includes a component pickup subsystem 32, means 34 for controlling the acquisition of the component pickup subsystem 32, and an image generation subsystem 40 (see FIGS. 4–7). Preferably, the fixed placement head 30 also includes a concentrically mounted heater array subsystem 50 (see FIGS. 9–10).

The fixed placement head 30 has the component pickup subsystem 32 concentrically disposed with respect to the central axis CA of the fixed placement head 30. The central core section of the fixed placement head 30 may be left open for operation of the component pickup subsystem 32. The component pickup subsystem 32 is operative for movement in the Z-direction to pickup an IC device to be mounted, for Θ-movement about the central axis CA to angularly orientate the IC device for placement as required, and for movement in the Z-direction to place the device in aligned position with the placement site on the printed circuit board. The pickup subsystem 32 may also be utilized to hold the IC device in aligned position on the circuit board for reflow bonding. One preferred embodiment of the component pickup subsystem 32 is a vacuum probe subsystem of the type known to those skilled in the art.

The vacuum probe subsystem 32 includes a vacuum pickup tube 33 that is orientated coaxially with the central axis CA of the fixed placement head 30. The vacuum pickup tube 33 is coupled to a suitable source of negative pressure (not shown) such that a predetermined suction force (sufficient to lift the IC device) is available at the tip of the vacuum pickup tube 33. The vacuum pickup tube 33 is linearly movable in the Z direction and is rotatable about the central axis CA (Θ-movement).

The probe subsystem control means 34 is interconnected to the master control subsystem 60 by line 35 and the vacuum probe subsystem 32 and operative to move the vacuum pickup tube 33 in a first Z-direction to engage the IC device to be mounted and in a second Z-direction to release the IC device. The control means 34 is also operative to concomitantly supply negative pressure to the vacuum pickup tube 33 when the vacuum pickup tube 33 engages the IC device, and to terminate the negative pressure to the vacuum pickup tube 33 for release of the IC device. The control means 34 is further operative to regulate the Θ-movement of the vacuum pickup tube 33 to angularly orientate the IC device on the end of the vacuum pickup tube 33 for fine lead-to-pad alignment as discussed in further detail hereinbelow.

The image acquisition subsystem 40 is operative to generate images of at least one pair of diagonally opposed corners of the designated placement site 16 and/or the IC device 17 from the same optical perspective. These images are utilized to verify proper lead-to-pad alignment during placement, and may also be used to verify lead-to-pad alignment prior to and after bonding operations. The image acquisition subsystem 40 provides the accuracy demanded for proper alignment of IC devices such as FPDs by providing simultaneous images of the lead-to-pad alignment on each of the four sides of the FPD. The image acquisition subsystem 40 is also configured for simultaneous use in conjunction with the coaxially disposed component pickup subsystem 32 as described in the preceding paragraphs.

Figure 2:
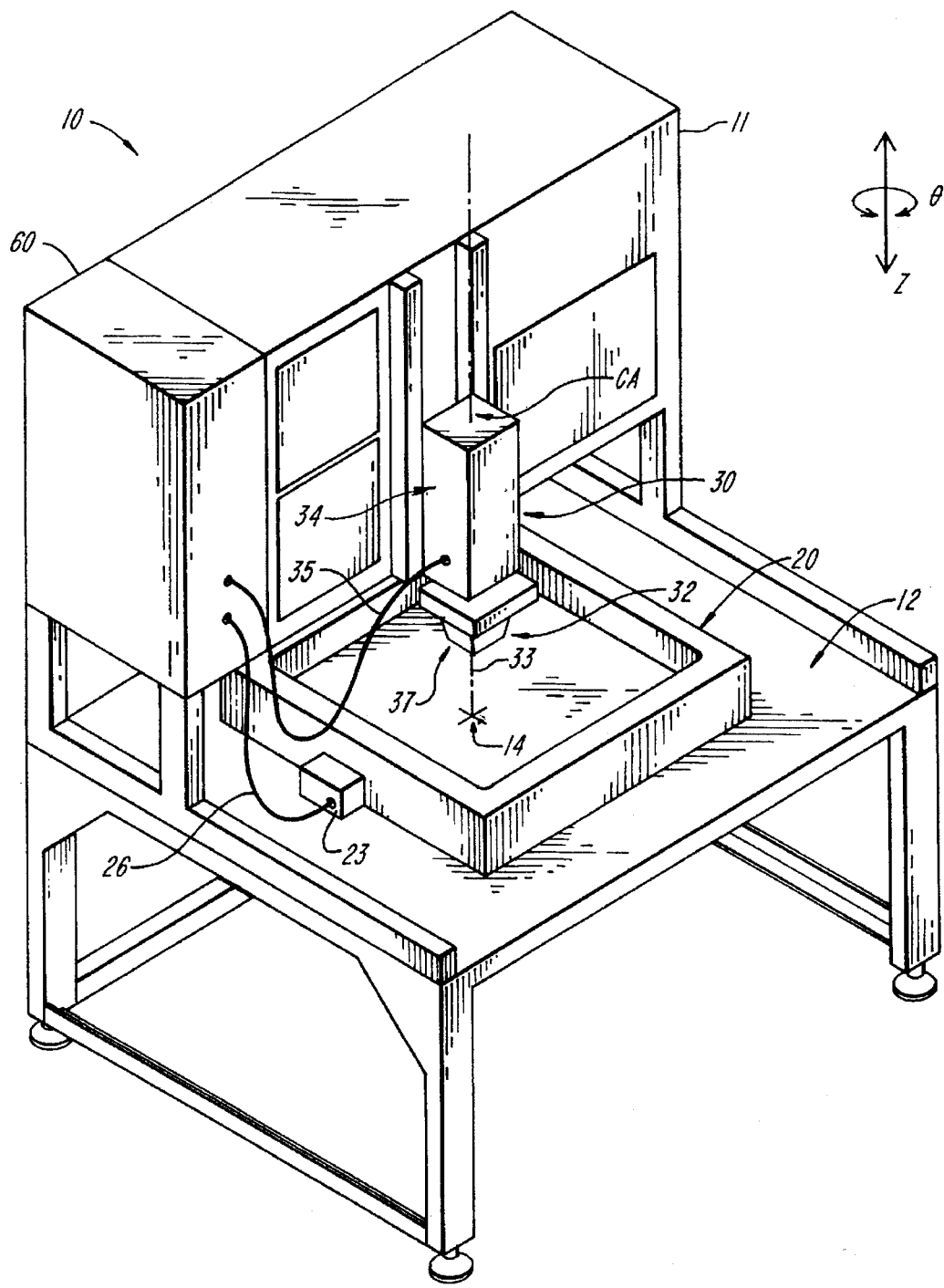
FIG. 2 is a perspective view of a guidance type placement apparatus according to the present invention.
Figure 3:
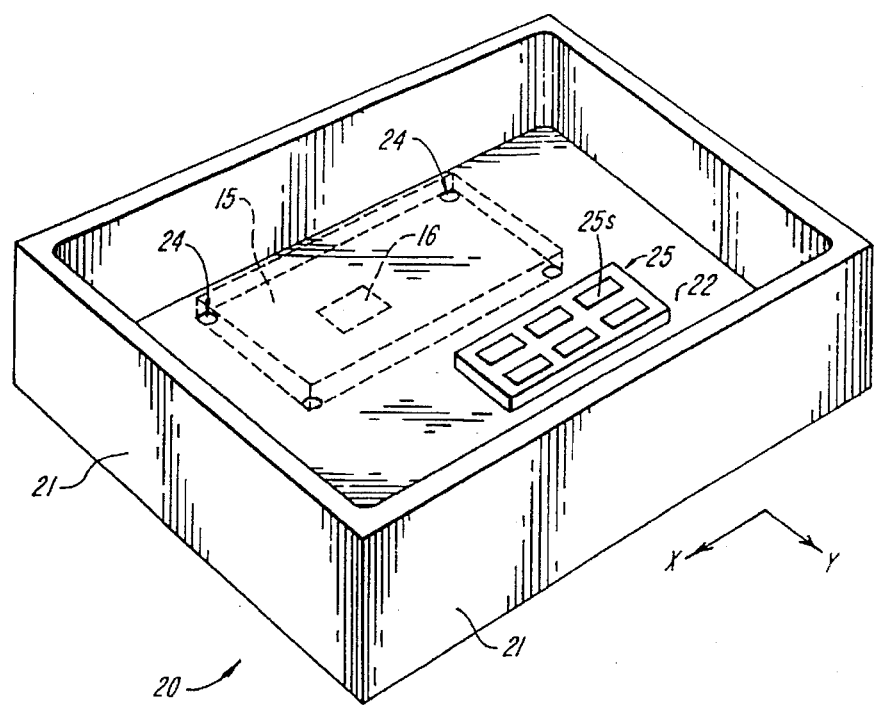
FIG. 3 is a perspective view of an X-Y table.

Preferably, an image processing subsystem 62, exemplarily illustrated in FIG. 2 as part of the master control subsystem 60, is utilized in combination with the image acquisition subsystem 40. The image processing subsystem 62 receives the images of the placement site 16 and/or the IC device 17 and generates machine coordinates defining the location and orientation thereof with respect to the reference point 14. The machine coordinates generated by the image processing subsystem 60 may be utilized by the master control subsystem 62 for automation of the placement process. It is to be understood that an operator may interface directly with the image acquisition subsystem 40 to manually effect the placement process.

The image acquisition subsystem 40 produces overlapping images from the same perspective of diagonally-opposed corners of the workpiece and provides a superimposed image of diagonally opposed corners of the workpiece for coarse and fine lead-to-pad alignment as described hereinbelow in further detail.

As illustrated in FIGS. 4–7, the image acquisition subsystem 40 comprises a first reflecting member 41, an adjustable, split reflecting member 42, and an image receiving means 43. The subsystem 49 is optically configured so that only the first reflecting member 41 is disposed concentrically with respect to the central axis CA. The adjustable, split reflecting member 42 and the image receiving means 43 may be disposed spaced apart from and parallel to the fixed placement head 30.

The first reflecting member 41 is disposed concentrically about the central axis CA and configured so that the vacuum pickup tube 33 passes through the center of the first reflecting member 41. The first reflecting member 41 is orientated (for the embodiment illustrated at an angle of 45° with respect to the base 22 of the X-Y table 20) to reflect the image of the workpiece disposed in the X-Y table 20 immediately below the central axis CA of the fixed placement head 30.

As will be discussed in further detail hereinbelow, the imaged workpiece may comprise the bonding pad matrix (placement site 16 for the IC device 17) of the printed circuit board 15 or the IC device 17 to be mounted. A less-than-true image of the workpiece is reflected by first reflecting member 41 due to the vacuum pickup tube 33 passing through the center of the reflecting member 41. However, as will become clear from the ensuing description, this distortion of the reflected image does not affect the utility of the superimposed image for verifying lead-to-pad alignment.

Figure 5:
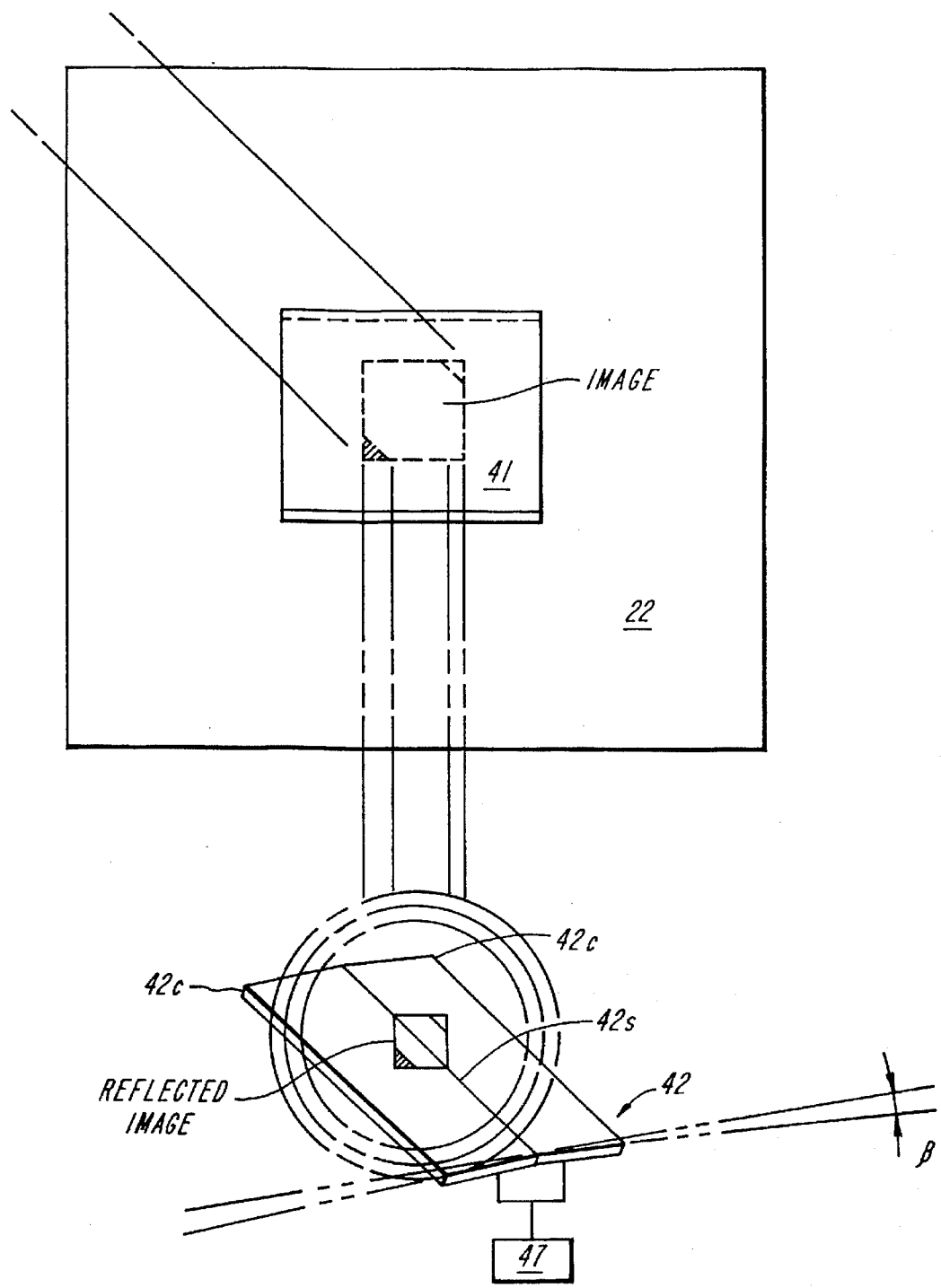
FIG. 5 is a plan view depicting the angular relationship between the panels of the split reflecting member of FIG. 4.

Referring now to the FIG. 5, the corners 42c of the adjustable, split reflecting member 42 are orientated such that the slit 42s of the split reflecting member 42 is aligned with one diagonal of the image reflected by the first reflecting member 41. The corners lying on the non-aligned diagonal of the reflected image are the corners of interest that are utilized to provide the superimposed image. The reflected image adjacent to the slit 42s is not utilized in forming the superimposed image, and therefore any image distortion caused by the vacuum pickup tube 33 does not affect the utility of the image acquisition subsystem 40 in forming an image to verify proper lead-to-pad alignment.

The adjustable angular relationship between the first and second panels comprising the split reflecting member 42 is illustrated in FIG. 5. When the first and second panels are coplanar, the reflected image from the first reflecting member 41 is relayed as a single image to the image receiving means 43 as illustrated by reference numeral 44 in FIG. 6. When the panels are adjusted so that the angle between the panels is greater than zero (nonplanarity), the first and second panels will each divergingly reflect an image of the workpiece to image receiving means 43 as illustrated by reference numerals 44', 44", respectively, in FIG. 6.

Figure 6:
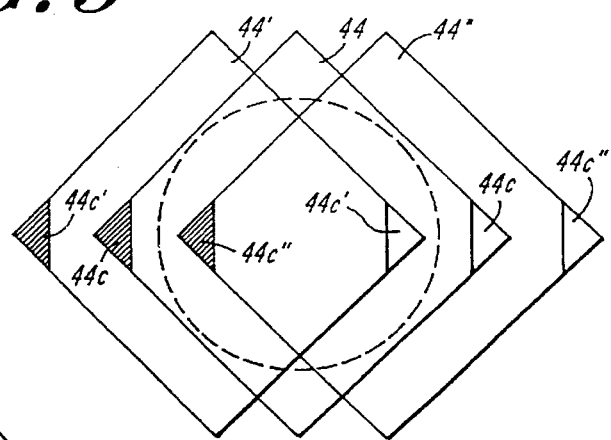
FIG. 6 is a plan view of the overlapping images generated by the image generation subsystem of FIG. 4.

The opposed corners of interest of the various images that may be generated by the split reflecting member 42 are identified in FIG. 6 as 44c, 44'c, and 44"c, respectively. With the first and second panels nonplanar, the images of interest are 44' and 44", and an examination of FIG. 6 shows that one corner 44'c of the image generated by the first panel is juxtaposed with a corner 44"c of the image generated by the second panel. It will be observed that the distance between these corners is less than the distance between that of the reflected image of the opposed corners 44c of the split reflecting member 42 in the coplanar configuration. Thus, by adjusting the angle of nonplanarity between the first and second panels of the split reflecting member 42, the distance between juxtaposed corners 44'c, 44"c may be varied to form a superimposed image.

Figure 7:
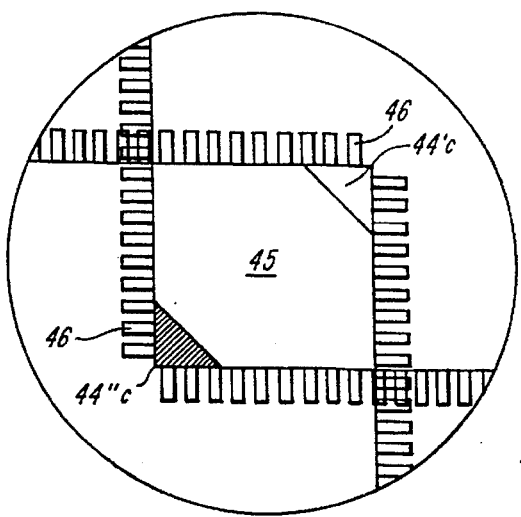
FIG. 7 is a plan view of the superimposed image produced by the image generation subsystem of FIG. 4.
Figure 4:
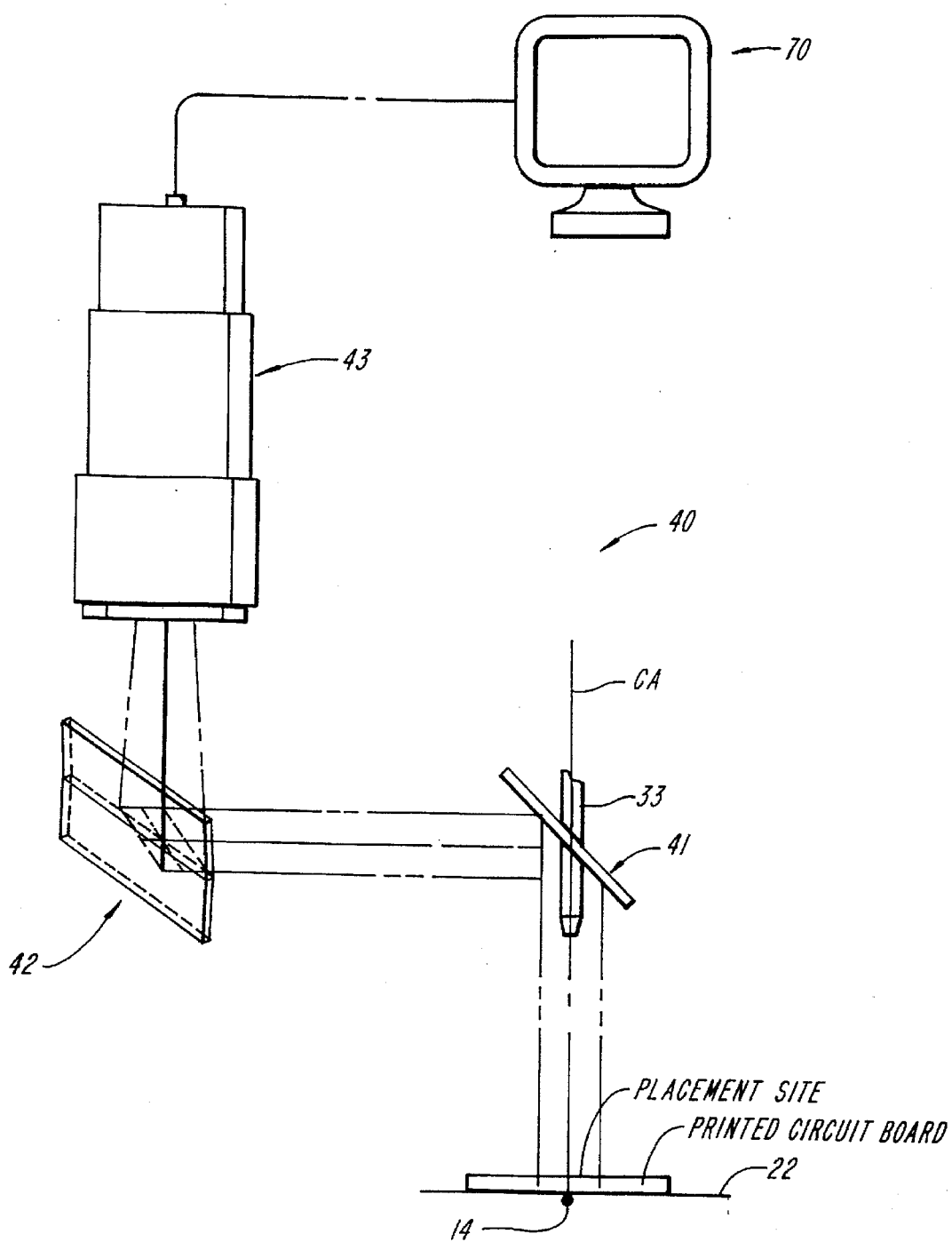
FIG. 4 is a plan view of one embodiment of an image generation subsystem for use with a guidance type placement apparatus.

FIG. 7 illustrates the superimposed image 45 formed by the image generating subsystem 40 described hereinabove. Corner 44'c of the reflected image formed by the first panel and corner 44"c of the reflected image formed by the second panel are juxtaposed to form the superimposed image 45 that is utilized to observe the pads of the placement site 16 and/or the IC device leads 46 of the diagonally opposed corners. The split image generation subsystem 40 as described hereinabove is particularly advantageous in that it may be readily utilized with a variety of IC devices of different sizes and configurations.

The image receiving means 43 may be any conventional means for viewing the formed superimposed image 45. For example, a video camera may be utilized as the image receiving means 43 to generate a video picture which may be transmitted to a remote viewing station 70 for verifying alignment. Alternatively, the image receiving means 43 may be a microscope. The image acquisition subsystem 40 also includes a means 47 (illustrated schematically in FIG. 5) disposed in combination with the split reflecting member 42 for adjusting the angle between the first and second panels thereof.

It will be appreciated that other image acquisition subsystems may be utilized in combination with the fixed placement head 30 as described hereinabove. For example, U.S. Pat. No. 4,914,513, owned by the assignee of the present invention, describes an embodiment of a multivision component alignment system wherein a single video camera incorporating at least one pair of optical fibers may be utilized to electronically generate a split screen image of one pair (or both pairs) of diagonally opposed corners of a workpiece. Alternatively, multiple cameras may be positioned to generate images of the diagonally opposed corners of a workpiece.

Another possible embodiment of the image acquisition subsystem may be utilized with the embodiment of the fixed placement head 30 having an open central core section. A microscope optical system (not shown) is disposed in the open central core section to permit viewing of diagonally opposed corners of the placement site 16 and/or the IC device 17.

The guidance type placement apparatus 10 as described in the preceding paragraphs may also include an illumination subsystem 37 for illuminating the placement site 16 and/or the IC device 17 to enhance observation of the work pieces during placement and reflow operations. The illumination subsystem 37 may consist of any conventional light source such as LEDs. The illumination subsystem 37 is mounted and orientated to provide illumination of the work pieces so that light is reflected from the work pieces to the image acquisition subsystem 40. Of particular importance is the reflection of illuminating light from the bonding sites during the placement and reflow operations to enhance the efficiency of these operations.

For example, the illumination subsystem 37 may be mounted in combination with the fixed placement head 30 as exemplarily illustrated in FIG. 2 and configured and orientated to illuminate the reference position 14. During operation of the guidance type placement apparatus 10, as described in further detail hereinbelow, the placement site 16, the IC device 17, and the combination of the placement site 16 and IC device 17 will be sequentially positioned at the known position. Alternatively, the illumination subsystem 37 may be disposed in combination with the sidewalls 21 of the X-Y table 20 and orientated to illuminate the placement site 16. This embodiment will provide reflection of illuminating light from the bonding sites during the placement and reflow operations.

The image acquisitions subsystem 40 utilized in combination with the guidance type placement apparatus 10 of the present invention preferably incorporates a single video camera 43 to generate images for verifying lead-to-pad alignment. Variations in camera position and magnification, which are possible sources of misalignment errors in a ballistic type placement system that utilizes two separate video cameras, are virtually eliminated in a single camera image acquisition subsystem.

Operation of the guidance type placement apparatus 10 as described hereinabove is described with reference to FIGS. 8A–8D and is presented in terms of the matrix tray 25 which holds a single IC device 17 to be placed onto the printed circuit board 15. The master control subsystem 60 will have been reprogrammed with a placement protocol and the location of the placement site 16 (bonding pad matrix or fiducials) on the circuit board 15, the IC device 17 identification, and the location of the component site 25s of the IC device 17.

The placement protocol utilizes the image acquisition subsystem 40 to generate images of the placement site 16 and/or the IC device 17. The image processing subsystem 62 utilizes the generated images to derive machine coordinates defining the location and orientation of the placement site 16 and/or the IC device 17 which are utilized by the master control subsystem 60 to generate corrective offset movements (X, Y, Θ) to provide the required degree of accuracy in lead-to-pad matching.

The placement protocol is a two-phase process that sequentially effects coarse lead-to-pad alignment followed by fine lead-to-pad alignment (when required), and placement. The placement protocol utilizes the image acquisition system 40 as a feedback control to define successive offsets between the leads and pads so that iterative corrective movements may be generated to achieve lead-to-pad alignment with the predetermined degree of accuracy. The placement process according to the present invention is insensitive to magnification effects in deriving/applying angular offsets during the coarse alignment phase. Magnification effects are irrelevant during the fine alignment phase.

Figure 8A:
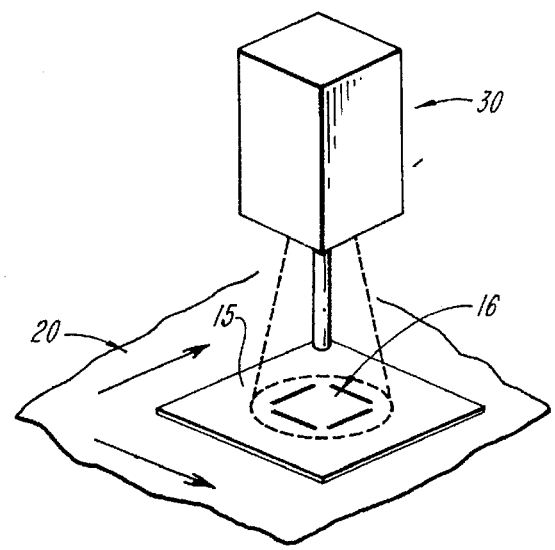
FIGS. 8A, 8B, 8C, and 8D schematically illustrate the two phase operation of the guidance type placement apparatus according to the present invention.

To initiate coarse alignment, the control subsystem 60 executes a command to initially move the X-Y table 20 to concentrically position the placement site 16 (bonding pad matrix or fiducials) to be populated with the reference point 14 of the fixed placement head 30 as illustrated in FIG. 8A. The image acquisition subsystem 40 is utilized to acquire an image of diagonally opposed corners of the placement site which are used to generate machine coordinates of the image which are stored and correlated to the current location of the X-Y table 20.

Figure 8B:
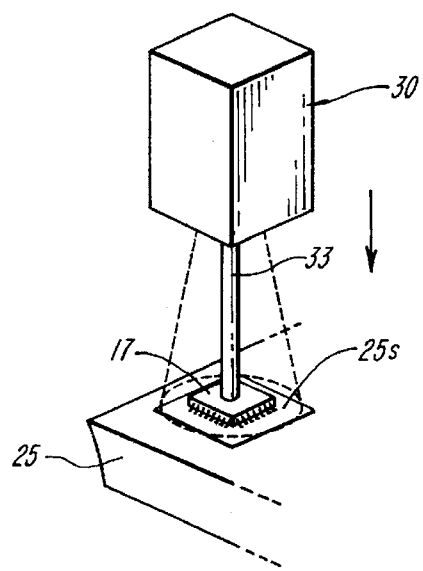

The control subsystem 60 then executes a command to move the X-Y table 20 to concentrically position the component site 25s of the matrix tray 25 with the reference point 14 of the fixed placement head 30 as illustrated in FIG. 8B. Another command is executed to activate the component pickup subsystem 32 for Z-movement of the vacuum pickup tube 33 to pickup the IC device 17 and to move the IC device 17 to a "near placement" position. In the near placement position, the IC device 17 lies in a plane that is substantially coplanar with the plane of the placement site 16, i.e., the IC device 17 is optically spaced apart from the image acquisition subsystem 40 to the same degree as the previously acquired image of the placement site 16. For the embodiment described, the near placement position of the IC device 17 is approximately 0.010 to 0.080 inches.

Near placement positioning ensures that the acquired images of the IC device 17 and the placement site 16 have comparable magnification. Near placement positioning also compensates for any Z-movement runout caused by operation of the component pickup subsystem 32.

With the IC device 17 held in the near placement position above the matrix tray 25, the image acquisition subsystem 40 is utilized to acquire a near placement image of diagonally opposed corners of the IC device 17 that are used to generate machine coordinates of the image. At this point, the control subsystem 60 has determined the positions and orientations of the leads of the IC device 17 and the bonding pads by means of the sequential images captured by the image acquisition subsystem 40.

The master control subsystem 60 derives the angular offset (if any) between the IC device 17 and the placement site 16 by correlating the respective machine coordinates. The component pickup subsystem 32 is activated and the derived angular offset is applied to the IC device 17 by Θ-movement of the pickup tube 33. The foregoing described steps of IC device 17 image acquisition, derivation of angular offset, and correction for angular offset may be reiterated as necessary to achieve the desired degree of angular alignment.

Figure 8C:
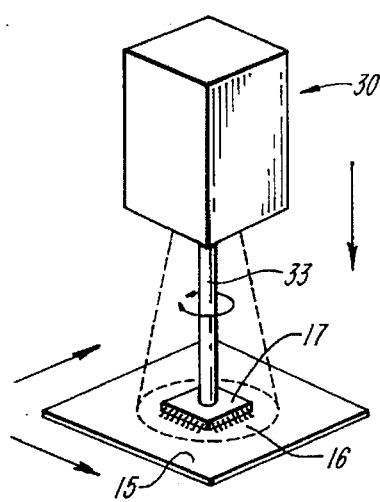

The X, Y offsets between the IC device 17 and the placement site 16 are then derived by the master control subsystem 60 utilizing the respective image information and machine coordinates. The control subsystem 60 causes the X-Y table 20 to concentrically reposition the placement site 16 with the reference point 14, as illustrated in FIG. 8C, such that the IC device 17 is superposed in the "near placement position" above the placement site 17. The component pickup subsystem 30 may be concomitantly activated as necessary for Z-movement of the vacuum pickup tube 33 to raise/lower the IC device 17 to ensure that the IC device 17 clears the circuit board 15 and/or components mounted thereon during repositioning of the X-Y table 20. The X-Y table 20 is then moved to apply the derived X, Y offsets to linearly align the IC device 17 with the placement site 16.

The coarse alignment phase as described in the preceding paragraphs may be likened to a process wherein images of separate work pieces are acquired from the same optical perspective by a single video means. The acquired images are then superposed and rotated and/or linearly moved as necessary until a match is achieved between the images.

Upon completion of the coarse alignment phase as described in the preceding paragraphs, the fine alignment phase may be implemented by the master control subsystem 60. The placement protocol includes an option that permits fine alignment to be implemented on a site-by-site and/or device-by-device basis. The placement protocol option may include flags that identify specific placement sites 16 and/or IC devices 17 where fine alignment is required. Alternatively, fine alignment may be implemented for quality control purposes to ensure that the desired degree of accuracy in lead-to-pad alignment is being achieved.

Figure 8D:
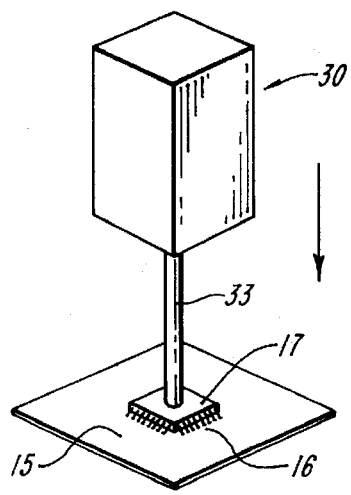

With the IC device in the near placement position, the image acquisition subsystem 40 generates a superposed image of diagonally opposed corners of the IC device and the placement site in the near placement position to determine lead-to-pad offsets at diagonally opposed corners. Any lead-to-pad offsets are determined, utilizing the same optical perspective of the superposed image, and this information is processed by the control subsystem 60 to generate commands for compensating movements required for fine lead-to-pad alignment at opposed corners. Commands are issued to the X-Y table 20 and/or the vacuum pickup tube 33, as required, to effect compensating X, Y and Θ movements for lead-to-pad fine alignment. Iterative corrections are applied as necessary to achieve lead-to-pad alignment with the predetermined degree of accuracy. After fine alignment, a final command is issued to cause Z-movement of the vacuum pickup tube 33 to place the IC device 17 in contact with the placement site 16 as illustrated in FIG. 8D. At this point, the vacuum pickup tube 33 may be disengaged from the IC device 17 by terminating negative pressure at the tip of the vacuum pickup tube 33.

The operation of the guidance type placement apparatus 10 as described hereinabove achieves higher placement accuracies than can be obtained with conventional ballistic type placement systems. All measurements and corrective movements are based upon the relative locations of the placement site and the IC device derived from the same optical perspective such that lead-to-pad alignment is not dependent upon knowing the absolute position of the image acquisition subsystem 40 on the placement head or the magnification thereof. All measurements and corrective movements are verified utilizing images generated along the same optical perspective during coarse and/or final alignment. The apparatus 10 is virtually insensitive to 0 discrepancies inasmuch as 0 corrections are achieved utilizing the same image acquisition subsystem 47.

It may be advantageous to bond IC devices immediately after placement to preclude subsequent lead-to-pad misalignment from occurring when the IC device is released by the vacuum pickup tube 33 and/or when the circuit board is subjected to handling prior to reflow bonding. Bonding the component to the circuit board while the component is maintained in alignment by the placement apparatus 10 significantly reduces or eliminates lead-to-pad misalignment problems.

To provide bonding such as reflow soldering while the IC device 17 is being held in place by the placement apparatus 10 requires a heater array subsystem that may be mounted in combination with the fixed placement head 30. This imposes a design constraint on the heater array subsystem wherein the subsystem must be configured for concentric disposition and operation with respect to the fixed placement head 30. Concentric disposition and operation of the heater array subsystem permits unimpeded operation of the vacuum pickup tube 33 and the image acquisition subsystem 40 during placement and prior to and following bonding operations, thereby ensuring maintenance of the final lead-to-pad alignment during the bonding operation.

Successful and cost effective implementation of an integral heater array subsystem is influenced by component size, component range, lead type, lead pitch, lead count, circuit board type, circuit board component mix, and circuit board topography, and the nature of the apparatus utilized to provide the thermal energy for the bonding operation. Different methods of providing thermal reflow energy are not necessarily suited to all applications inasmuch as different methods provide different performance characteristics.

Performance characteristics such as programmability of heating, temperature control, temperature uniformity, thermal separation, packaging restrictions, and cycle time and cost all must be considered in determining the type of heater array subsystem. Programmability of heating includes the capability to automatically or manually vary the pattern of heating to the component as well as the ability to program and vary heating parameters such as time and temperature on a component by component and/or site by site basis. Temperature control is the degree to which the temperature of the heating element and/or board can be controlled or predicted as well as the uniformity of heat being delivered to the reflow sites. Thermal separation is the degree to which heating can be limited to the area of interest such as the component leads, thereby avoiding heating in undesired areas such as the component package and/or adjacent solder joints.

Packaging restrictions relate to the effective range of the heating method such as the sizes of the component packages the subsystem is capable of handling, the proximity of the heating elements to the heating sites and potential interference with components on the board. Cycle time relates to the time required to bring the site to reflow temperature and cycle cost includes initial equipment costs, maintenance costs and tooling costs.

Several different means of generating thermal energy for bonding of IC devices to circuit boards may be utilized in combination with the guidance type placement apparatus 10 as described hereinabove. One heater array subsystem 50 having particular utility for use in combination with the fixed placement head 30 as disclosed hereinabove is described and claimed in commonly owned, U.S. Pat. No. 5,060,288 entitled IR Heater Array Apparatus, issued Oct. 22, 1991, which incorporated herein by reference.

The heater array subsystem 50 described in the foregoing application generates focused infrared (IR) radiation that provides excellent thermal separation at the bonding sites. The focused IR radiation pattern provided by the subsystem 50 has a linear configuration of minimal width, making it eminently suitable for use with IC devices having X and Y linearly-orientated bonding sites such as the IC device 17 illustrated in FIGS. 8B–8D.

The subsystem 50 provides good temperature control and uniformity at the bonding sites, and is readily adaptable to automation under the master control subsystem 60. Both the heating parameters and the heating pattern of the subsystem 50 may be automatically or manually varied. The subsystem 50 is capable of accommodating IC packages of varying sizes and lead configurations. The configuration of the system 50 facilitates concentric mounting of the subsystem 50 in combination with the fixed placement head 30 without interference with the component pickup subsystem 32 or the image acquisition subsystem 40.

Figure 9:
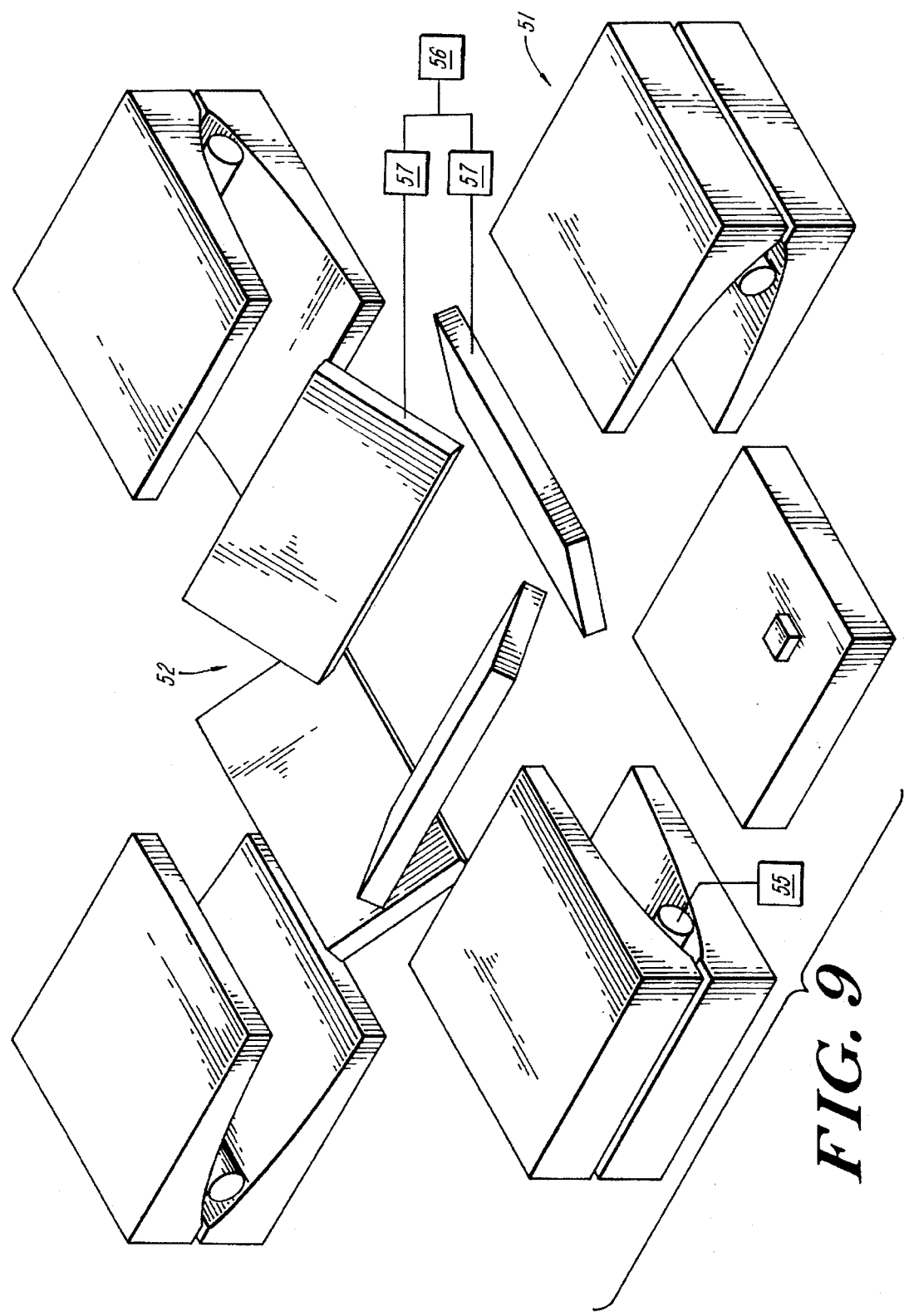
FIG. 9 is a perspective view illustrating the infrared radiation generating components of an IR heater array subsystem.
Figure 10:
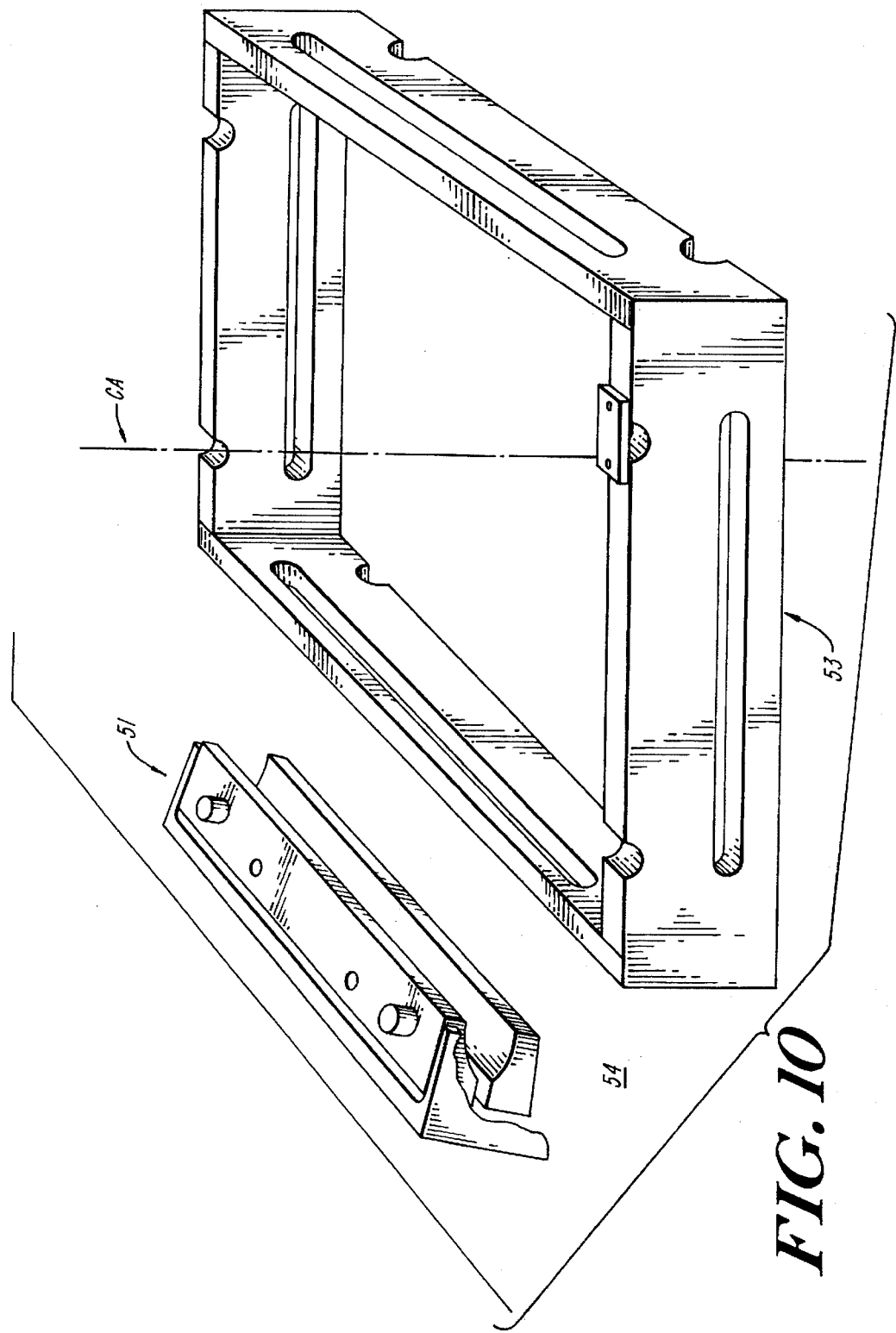
FIG. 10 is a partial perspective view illustrating the mounting components for the IR heater array subsystem of FIG. 9.

With reference to FIGS. 9 and 10, the heater array subsystem 50 includes four individual IR subassemblies 51, opposed pairs of X, Y reflecting members 52, a frame member 53, a base member 54 and control subsystems 55, 56 for controlling the operation of the IR subassemblies 51 and aligning the focused IR radiation generated thereby, respectively. The IR subassemblies 51 and reflecting members 52 are disposed concentrically about and spaced apart from the central axis CA of the fixed placement head 30.

Each IR subassembly 51 includes a linear IR lamp for generating IR radiation which is mounted within a lamp envelope that is configured to focus the generated IR radiation into a straight line heating pattern. A lamp envelope having a partial elliptical configuration is effective to convergingly reflect sufficient IR radiation generated by the IR lamp to effectuate the reflow process at the bonding sites. In particular, a lamp envelope having a hemi-elliptical configuration, with the IR lamp mounted at one of the foci and the other foci constituting the focal plane for the convergingly reflected radiation, provides convergingly reflected IR radiation having an energy level sufficient for reflow soldering.

The focused IR radiation generated by the IR subassemblies 51 is reflected by means of the opposed pairs of X, Y reflecting members 52 to align with the X, Y orientated bonding sites of the IC device held in place by the component pickup subsystem 32. The reflecting members 52 are rotatably mounted in combination with the frame member 53. Each sidewall of the frame member 53 includes a radiation slot for transmitting IR radiation from the IR subassemblies 51 disposed outside the frame member 53 to the corresponding X, Y reflecting member 52. Movable shields are disposed in combination with each radiation slot to permit variations in the heating pattern of the focused IR radiation to accommodate IC packages of different sizes.

The opposed pairs of reflecting members 52 are slaved together for adjusting the plane of incidence of the focused IR radiation onto the X, Y linearly-orientated bonding sites, respectively. An adjusting mechanism 57 is disposed in combination with each opposed pair of reflecting members 52 to change the reflective angle of the IR radiation, and concomitantly, the plane of incidence of the focused IR radiation. One embodiment of an adjusting mechanism 56 is described in commonly owned, U.S. Pat. No. 5,060,288 entitled IR Heater Array Apparatus. The adjusting mechanism 57 may be operated manually or under the control of the control subsystem 56.

The IR subassemblies 51 and the frame member 53 are mounted in combination with the base 54. The base 54 is configured for mounting the heater array subsystem 50 in combination with the fixed placement head 30. The heater control subsystems 55, 56b are interconnected to the IR subassemblies 51, the movable shields and the adjusting mechanism 56 to control the generation of IR radiation, the heating pattern and the plane of incidence of the focused IR radiation. The heater control subsystems 55 are interconnected to the master control subsystem 60.

Other heater array subsystems may be utilized in combination with the fixed placement head 30 as described hereinabove. For example, a hot gas apparatus consisting of a linear array of orifices with electrical heating elements in each orifice to selectively heat gas forced through the orifices may be utilized to provide thermal energy at the bonding sites. Alternatively, contact heaters utilizing an array of movable blades heated by electrical resistance (thermode) or hot gas (convector) may be utilized to provide thermal energy at the bonding sites.

For a guidance type placement apparatus 10 incorporating an integral heater array subsystem 50 as described hereinabove, the bonding operation is accomplished while the vacuum pickup tube 33 is positioned to maintain the leads of the IC device in aligned combination with the bonding pads of the placement site as illustrated in FIG. 8D. The IR subassemblies 51 are operated to generate focused IR radiation having a predetermined power level for a predetermined period of time (cycle time). The opposed pairs of X, Y reflecting members 52 are adjusted as necessary to align the heating pattern of the focused IR radiation with the bonding sites to effectuate bonding.

The guidance type placement apparatus as described hereinabove achieves a higher degree of accuracy in lead-to-pad alignment than is possible with conventional ballistic type placement systems since performance is based upon resolution and repeatability and not on absolute positioning accuracy. The guidance type placement apparatus provides more consistent performance with lower equipment and maintenance costs because the apparatus is less sensitive to alignments and calibrations and instabilities of the equipment over time and with change of temperature. The guidance method of achieving lead-to-pad alignment as described hereinabove monitors the degree to which the IC device is aligned with the placement site prior to placement and reflow, thus providing immediate feedback and control during the placement and reflow processes for more reliable and predictable processes.

Figure 11:
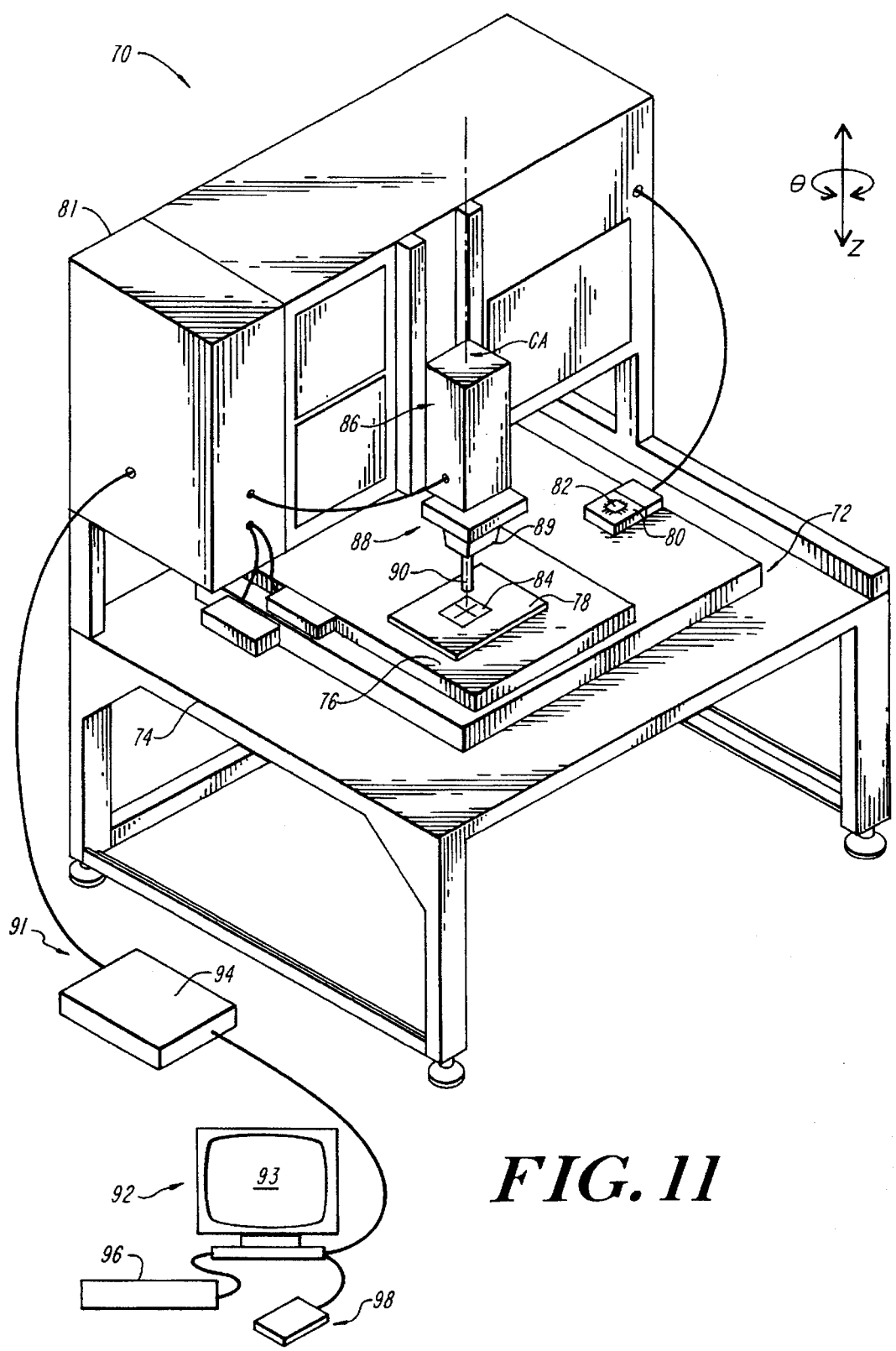
FIG. 11 is a perspective view of a placement apparatus according to a further aspect of the present invention.

Referring now to FIG. 11, a placement system 70 includes a subcarriage 72 disposed over a base 74. The subcarriage 72 is moveable over the base 74 in at least first and second opposite directions. The subcarriage 72 may be driven between the first and second positions by pneumatic cylinders actuated by a controller. The pneumatic cylinders may be manually driven or alternatively may be motor driven.

A first stage 76 is movably coupled to the subcarriage 72, for positioning a circuit board 78. The first stage 76 is moveable in at least first and second orthogonal directions here shown as X-Y directions with respect to the subcarriage 72. The stage 76 may also be manually driven or may be driven by means of a controller and a motor coupled thereto.

A second stage 80 is also movably coupled to the subcarriage 72. Thus, the second stage 80 is here coupled to the first stage 76 through the subcarriage 72. As will be described further below, in some applications the second stage 80 may be disposed on the first stage 76. The second stage 80 is provided for holding a circuit component 82 to be placed in a placement site 84 of the circuit board 78 and is here moveable in first and second orthogonal directions here shown as X-Y directions with respect to the subcarriage 72. The second stage 80 is also movable in the θ direction and may thus rotate a circuit component 82 disposed thereon. Thus, the second stage is provided having three degrees of freedom.

The component stage 80 may be driven by motors controlled with a keypad or joystick or may also be manually driven. Alternatively, the component stage 80 may be automatically driven by means of a component stage controller coupled thereto.

It should be noted that one or each of the subcarriage 72, the first stage 76 and the second stage 80 may be provided as two separate sub-stages one sub-stage which moves only in the X direction and one sub-stage which moves only in the Y direction.

The placement system 70 further includes a fixed placement head 86. The fixed placement head includes an imaging system 88 having an adjustable, predetermined field of view and a component pickup system 90.

The imaging system 88 is provided to identify the circuit board 78 and particular features thereof and also to identify the circuit component 82. The imaging system 88 may be provided for example as a split mirror imaging system as described above in conjunction with FIGS. 4–7. As also described above, the imaging system 88 may be disposed co-axially with the component pickup system 90.

The imaging system 88 includes a viewing system 89 which may be provided for example as a fiberoptic viewing system or a camera viewing system having an adjustable predetermined field of view for example. Examples of such viewing systems are described in U.S. Pat. No. 4,914,513 issued Apr. 3, 1990 assigned to the assignee of the present invention and incorporated herein by reference.

The component pick-up system 90 is provided for picking up the circuit component 82 from the stage 80 and placing the circuit component 82 at the placement site on the circuit board 78. The pick-up system includes a pick-up tool which may be provided for example as a vacuum tube. The component pickup system 90 may also include means for actuating and controlling the vertical movement of the pickup-tool to one or more vertical positions above the subcarriage 72, and stages 78, 80. Thus, once a user has visually identified the circuit component with the imaging system 86, the pick-up tool may then be actuated such that it is lowered to a position proximate the circuit component 82 such that when a vacuum is engaged, in the case when the pick-up tool is provided as a vacuum pickup tool for example, the circuit component 82 may be lifted from the stage 80 by the vacuum tube pick-up tool. The means for actuating and controlling may then be used to raise the pick-up tool such that the circuit component is raised a minimum clearance distance above the stages 78, 80.

The pickup system 90 is only required to independently move in a direction vertical to the surface on which the circuit board 78 is disposed. No other movement is required of the fixed placement head 86. Those of skill in the art will recognize of course that it may be advantageous in some applications to provide the pickup system 90 with the ability to rotate about its central axis CA in first and second opposite directions.

The component pick-up system 90 is thus disposed above the subcarriage 72, and is provided for picking up circuit components from a first surface of the second stage 80 and placing the circuit components in a predetermined position on the circuit board 78 disposed on the first stage 76. The component pick-up system 90 may also be used in some applications for picking up circuit components from a predetermined position on the circuit board 78 disposed on the first stage 76 and placing the circuit components on a first surface of the second stage 80. Such a step may be advantageous when the system 70 is used to remove a circuit component from an existing circuit board as is commonly done when it is necessary to rework or repair a circuit board or a circuit component.

The viewing system 89 is coupled to an interactive graphical user interface system 91. The interactive graphical user interface system 91 includes a monitor 92 coupled to the viewing system 89 via a processor 94 which may be provided as a microcomputer for example. The processor includes a frame grabber card, a position indicator generator and the ability to provide manually placed screen overlays. An alpha-numeric keyboard 96 and a user interface 98 are coupled to the processor 94. The user interface 98 is preferably provided as a graphical user interface (GUI) which displays a position indicator on the monitor screen 93. The user interface may be provided as a trackball, mouse, lightpen or a touch screen interface 98.

The graphical user interface system 91 may be provide for example as an AT & T compatible personal computer (PC) including a frame grabber video card, a mouse/trackball and an I/O control and which is compatible with Windows Version 3.1 software operation. Those of ordinary skill in the art will recognize of course that any interactive graphics system operating with equivalent hardware and software features may be used. Examples of such systems include but are not limited to, an IBM PC, an IBM compatible PC, a Macintosh PC, or an Apple PC may all be adapted for such use with the appropriate hardware and software systems.

As will be described further below in conjunction with FIGS. 12–17, the imaging system 88 displays an image of at least a portion of the circuit board or circuit component on the monitor screen 93, and the GUI 98 may be used to maneuver the position indicator on the monitor screen such that the position indicator designates or marks the location of a particular feature of the circuit board 78 or circuit component 82 on the image displayed on the monitor screen 93.

The imaging system 88 may be provided as a split mirror imaging system coaxially disposed about the pick-up system 90. Those of ordinary skill in the art, however, will recognize that any imaging system which provides a magnified and clear image of a selected feature of the circuit board 78 or circuit component 82 may be used.

It should be noted that if the circuit board stage 76 were provided as a motorized stage, it may then be preferable to eliminate the subcarriage stage 72 and dispose, in an appropriate position, the component stage 80 on the board stage 76. XY adjustments of the component 82 may then be accomplished by simply moving the board stage 76 and $\theta$ adjustments of the circuit component 82 may be accomplished by rotational movements of the component stage 80. Such rotational movements could be made manually or may be automated by means of a motor and a controller. A particular position of the board stage 76 and thus circuit board 78 could be stored in a memory of the interactive graphical user system 91 and after the circuit component 82 is aligned under the image system 88 the particular position of the board stage 76 could be recalled and the board stage 76 could be automatically aligned to the appropriate position to facilitate placement of the circuit component 82 at the placement site 84.

The particular operation of the placement system 70 will now be described in conjunction with FIGS. 12–17, in which like elements of the placement system 70 (FIG. 11) are provided having like reference designations.

Figure 12A:
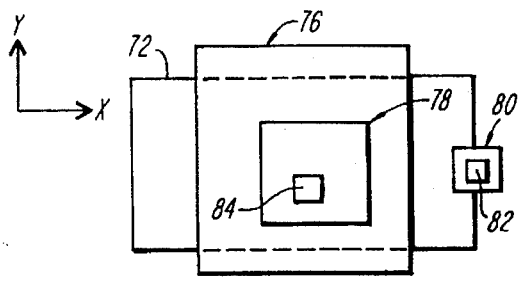
FIG. 12A is top view of the portion of the placement apparatus shown in FIG. 12.
Figure 12:
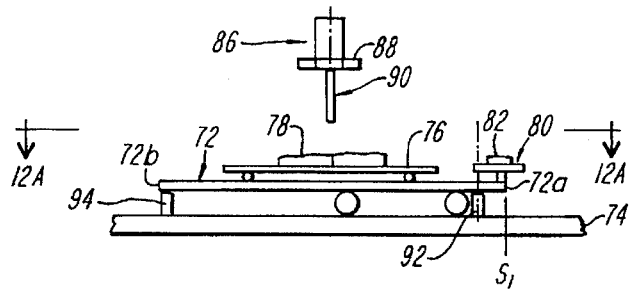
FIG. 12 is a side view of a portion of the placement apparatus of FIG. 11.

Referring now to FIGS. 12 and 12A, the subcarriage 72 is moved to a first predetermined position $S_1$ such that the edge 72a of the subcarriage is aligned with position $S_1$. Here a first subcarriage stop 92 prevents the subcarriage 72 from moving past position $S_1$ and thus ensures that the subcarriage 72 repeatedly stops at position $S_1$. When the subcarriage 72 stops at position $S_1$, at least a portion of the board stage 76 is placed within the field of view of the imaging system 88.

The board stage 76 is then moved to position the circuit board 78 such that the component placement site 84 is aligned under the fixed head 86.

Figure 13:
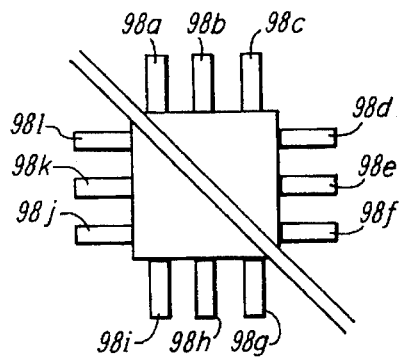
FIG. 13 is a plan view of a split image of a circuit board placement site produced by the imaging system and displayed on the monitor screen of the system of FIG. 11.

Referring now to FIG. 13, an image 96 of the circuit board 78 provided by the imaging system 88 is displayed on the monitor screen. Thus, a user observing the monitor screen 93 may direct movements of the board stage until the circuit board 78 is appropriately positioned within the field of view of the imaging system 88. The user may direct the movements of the board stage 76 by either manually moving the stage 76 or by controlling the movements of the stage 76 through the automated controller 81 (FIG. 11) until an image of the circuit board 78 appears on the monitor screen 93.

It should be noted that the site 84 on the circuit board 78 at which the component 82 is to be placed need only be approximately aligned within the field of view of the imaging system 88, such that the image of the site 84 is displayed on the monitor screen 93. Here the image of the circuit board is provided as a split image of the circuit board placement site 84. Thus, the user views particular circuit board pads 98a–98l generally denoted 98 on which will be placed corresponding leads of the circuit component 82.

After the circuit board site 84 is appropriately aligned under the imaging system, the board stage 76 is then locked into position relative to the subcarriage 72, manually or, preferably, automatically, such that no further X-Y movement of the board stage 76 relative the subcarriage 72 is possible. Thus if the subcarriage 72 does not move, no movement of the circuit board component placement site 84 relative the imaging system 88 can occur. It should be noted however that the subcarriage 72 may move in what is here shown as the X direction.

Figure 14:
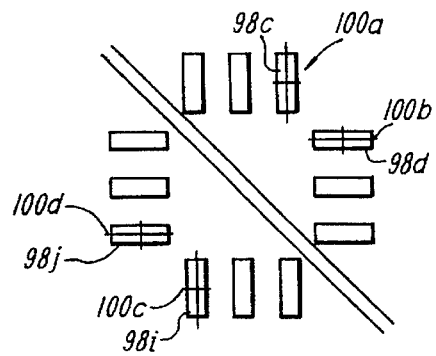
FIG. 14 is a plan view of a split image of a circuit board placement site having position indicators disposed thereon produced by user interface system of FIG. 11.

Referring now to FIG. 14, a plurality of position indicators 100a–100c generally denoted 100, here provided having a cross-hair shape, are used to designate or mark the position of a particular feature of the circuit board. Here the circuit board feature corresponds to the circuit board pads 98c, 98d, 98i and 98j. Each of the position indicators 100 may be maneuvered via the GUI 98 until the corresponding position indicator 100 is appropriately positioned by the operator to mark the selected feature of the circuit board 78. Each position indicator 100 is displayed on the monitor screen 93. When the position indicator is appropriately positioned, the position indicator is then "frozen" on the monitor screen. This may be accomplished for example, by "clicking" a mouse to leave a stationary cross-hair on the video monitor display. This process may then repeated to provide the plurality of stationary cross-hairs 100a–100d on the video screen.

Here, each of the position indicators 100 are maneuvered into positions corresponding to the centers of the four end-most pads 98c, 98d, 98i and 98j at the placement site 84. The position indicators 100a–100d are sequentially located in the center of each end pad 98 to thus mark the position of the center of each circuit board pad. As will be described further below, in some applications it may be desirable to mark the position of one or more circuit board features other than the circuit board pads 98.

Figure 15A:
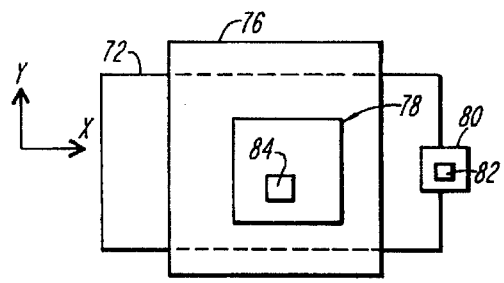
FIG. 15A is top view of the portion of the placement apparatus shown in FIG. 15.
Figure 15:
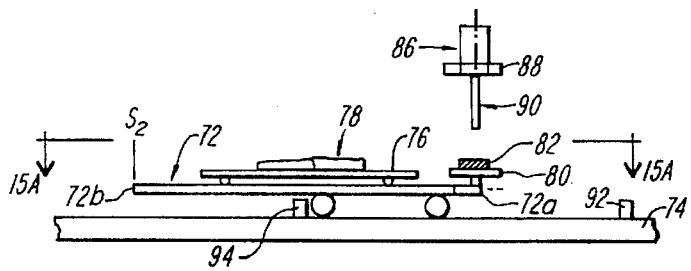
FIG. 15 is a side view of a portion of the placement apparatus of FIG. 11.

Referring now to FIGS. 15 and 15A, the subcarriage 72 is moved to a second predetermined position $S_2$ such that the edge 72b of the subcarriage 72 is aligned with position $S_2$. Here a second subcarriage stop 94 prevents the subcarriage 72 from moving past position $S_2$ and thus ensures that the subcarriage 72 repeatedly stops substantially at position $S_2$. When the subcarriage 72 stops at position $S_2$, at least a portion of the component alignment stage 80 is placed within the field of view of the imaging system 88. The component stage 80 having the circuit component 82 disposed thereon may be provided having a small amount of movement in first and second orthogonal directions, here shown as movements in X and Y directions in a cartesian coordinate system. As mentioned above the component stage 80 may also rotate about a central axis thereof. Here, the component stage 80 may move with three degrees of freedom. In some applications, however, it may be advantageous to provide the component stage 80 having more movement in more than three of degrees of freedom. For example, it may be desirable to allow the stage 80 to move in first and second opposite directions normal to the surface of the subcarriage 72. Such additional degrees of movement may simplify the component alignment step, for example, as will be described below in conjunction with FIGS. 16 and 16A.

Figure 14A:
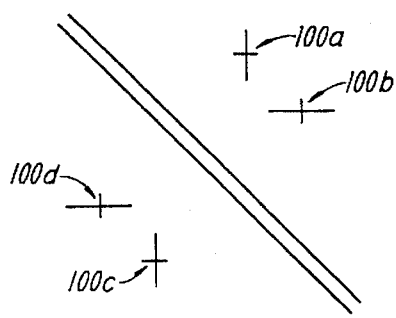
FIG. 14A is a plan view of a split image of the position indicators shown in FIG. 14.

It should be noted, and as shown in FIG. 14A, the four position indicators 100a–100d provided during the circuit board site alignment steps described above in conjunction with FIGS. 12–14 remain displayed on the monitor screen when the subcarriage 72 travels between the first and second subcarriage stops 92, 94. The image provided to the monitor screen 93 by the viewing system 89, such as a camera for example, changes in real time as the subcarriage, moves between the first and second positions.

When the subcarriage 72 stops in the second position, the image system 88 displays an image of at least a portion of the component stage 80. The component stage 80 is moved as necessary in one or both of first and second orthogonal directions to place particular features of the circuit component 82 within the field of view of the image system 88.

The circuit component end-most leads 83c, 83d, 83i, 83j may now be aligned with the four cross hairs 100a–100d generated and displayed on the monitor screen 93 during the board alignment step. When the circuit component leads 83c, 83d, 83i, 83j are correctly aligned to the corresponding position indicators 98c, 98d, 98i, 98j, the component pickup system 90 of the fixed head 86 lowers and picks up the circuit component 82. Thus, the position indicators 100 are here used to mark and align a particular feature of the circuit component 82 with circuit board 78 to thus facilitate the placement of the circuit component 82 with the component placement site 84.

Figure 16A:
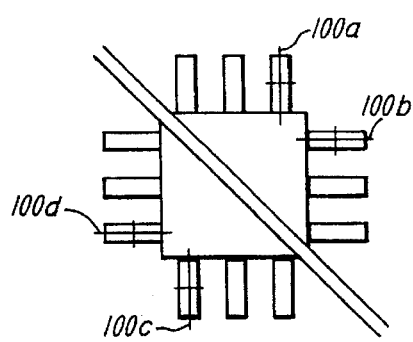
FIGS. 16 and 16A are a series of views of the split image of the circuit component provided on the monitor screen of the system of FIG. 11.
Figure 16:
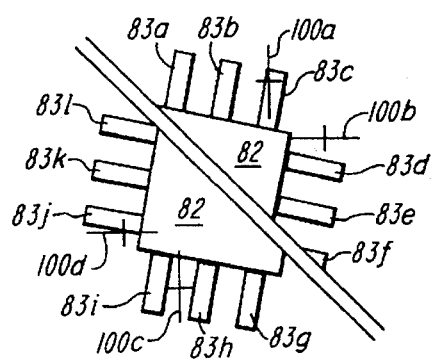

As shown in FIG. 16, in some instances the particular features of the circuit component 82 may not be aligned with position indicators 98. Here for example, the circuit component leads 83c, 83d, 83i, 83j are not aligned with the corresponding position indicators 100a–100d. Thus, in this instance the circuit component 82 should be moved to align the features i.e. leads 83c, 83d, 83i, 83j with position indicators 100a–100d.

Such movement may be accomplished, for example, by appropriately moving the component alignment stage 80 in X and Y directions as necessary and then rotating the component alignment stage 80 and thus the circuit component 82 to align the circuit component feature with the position indicators 100 displayed on the monitor. Alternatively, the features of the circuit component 82 may be aligned by picking up the circuit component 82 with the component pick up system 90 and appropriately rotating the circuit component 82 via the pick up system 90 to thus align the circuit component feature with the position indicators 100 displayed on the monitor.

Referring now to FIG. 16A, the selected features of the circuit component are shown aligned with the position indicators 100. Here, the position indicators 100a–100b have been used to mark the positions of the circuit board pads 98c, 98d, 98i and 98j with which corresponding circuit component leads 83c, 83d, 83i and 83j should be aligned. The position indicators 100 thus identify the positions of particular features on the printed circuit board 78 with which corresponding features on the circuit component 82 will be aligned.

In some applications it may be advantageous to identify the position of other features of the circuit board 78 (at the placement site 84) in addition to or in place of the circuit pads 98 at the placement site 84. For example, in some applications it may be desirable to identify the positions of a post or alternatively an aperture provided in the circuit board 78 or circuit component 82. It may also be desirable to identify the position of one or more edges of the circuit board 78 or circuit component 82.

Furthermore, position indicators 100 are here shown having a cross hair shape. It may, however, be advantageous in some applications to provided position indicators 100 having a shape other than the cross hair shape. For example, the position indicator 100 may be provided having a shape corresponding to a rectangle, a square, a triangle, a circle, or a moire pattern. Other shapes including irregular shapes provided from combinations of the above shapes may also be used.

A particular shape of a position indicator may be selected according to a variety of factors, including but not limited to, the particular shape of the feature on the circuit board or circuit component which is being displayed on the monitor screen 93. The particular shape or pattern of the position indicator may be selected to facilitate locating particular features of the circuit board 78 and circuit component 82 and aligning the circuit component with the placement site of the printed circuit board.

It should also be noted that the position indicators 100 need not all have the same shape or pattern. For example, a first position indicator may be provided having a circular shape, a second position indicator may be provided having a rectangular shape and a third position indicator may be provided having a triangular shape.

Figure 17A:
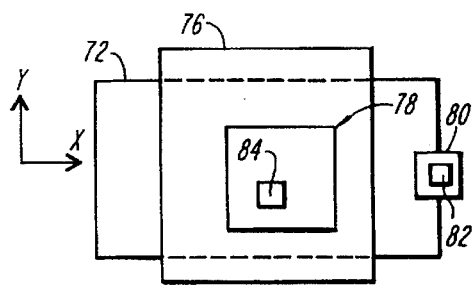
FIG. 17A is top view of the portion of the placement apparatus shown in FIG. 17.
Figure 17:
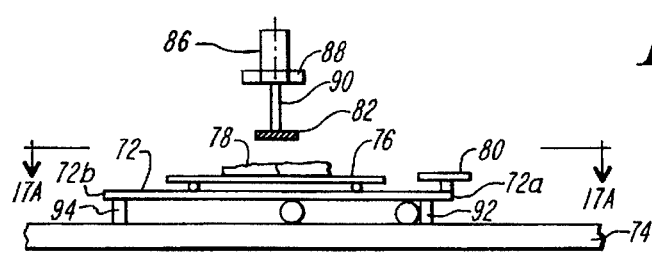
FIG. 17 is a side view of a portion of the placement apparatus of FIG. 11.

Referring now to FIGS. 17 and 17A, the subcarriage 72 is returned to the first position. Since this is the position in which the position indicators 100a–100d were first generated identifying the center of the end pads 98c, 98d, 98i, 98j of the placement site 84, and since the circuit component leads 83c, 83d, 83i, 83j were also aligned to the same position indicators 100a–100d, the circuit component leads 83c, 83d, 83i, 83j are thus aligned to the pads 98c, 98d, 98i, 98j of the placement site 84.

The circuit component 82 may now be placed by the component pickup system 90 onto the placement site 84. Further operations may also take place, such as soldering in place, etc., if required and part of the system design. Thus, one cycle of placement is completed.

Thus, by first "grossly" aligning the placement site 84 and locking the board stage 76 to the subcarriage 72 to prevent further X-Y movement of the board stage 76 relative to the subcarriage 72, then accurately locating the position corresponding to the center of the end most pads 98 of the site 84 by cross-hairs on the video screen, the board stage 76 holding the circuit board 78 may be temporarily moved away from the placement head 86 and then returned again to its original position.

The cross hairs 100 generated by the graphical user interface system 91 used by the operator, placed at the center of the end most pads 98 of the placement site 84 (with the split imaging system providing high magnification for precise alignment), allow the circuit component 82 to be aligned with the placement site 84. The circuit component 82 may still be aligned with the placement site 84 even when the circuit board 78 is moved out of the way, and later returned to its original position.

Since the board stage 76 and the component stage 80 are each mounted on the subcarriage 72 which moves only in a linear direction (here shown as the X direction) between the first and second stops 92, 94, when the sub-carriage 72 is placed in its first position, as shown in FIG. 12, the board stage 76 is disposed under the fixed placement head 86 and within the field of view of the imaging system 88 such that the placement site 84 may be aligned and then marked with the position indicators 100 via the graphical user interface system 91. Similarly, when the subcarriage 72 is placed in the second position, as shown in FIG. 15, the component stage 80 is located under the fixed placement head 86 within the field of view of the image system 88 such that the circuit component 82 may be aligned to the position indicator pattern provided from the step of aligning the board placement site.

A variety of modifications and variations of the present invention are possible in light of the above teachings. For example, the master control subsystem was illustrated as a stand alone unit hereinabove for purposes of clarity. It will be appreciated that the master control subsystem may be integrated into the structure of the apparatus, as, for example, in the cabinet. In a similar vein, the foregoing description described several control means for regulating the operation of the associated subsystems. It will be appreciated that in an integral system, control operations may be effected directly by the master control subsystem, thereby eliminating the need for separate subsystem control means.

Furthermore, while the position indicators have here been first aligned over a particular feature of the circuit board as described in conjunction with FIGS. 12–14 above, in some applications it may be advantageous to instead first align the position indicators over a particular feature of the circuit component. The circuit board may then be positioned accordingly such that the circuit board placement site is aligned with the position indicators. Thus, for example, if the position indicators identify the positions of the circuit component leads, rather than the positions of the circuit board pads, the circuit board could then be moved such that the circuit board pads are aligned with the position indicators. This technique still allows the circuit component to be appropriately placed at the designated circuit board placement site.

It is therefore to be understood that within the scope of the appended claims, the present invention may be practiced otherwise than as specifically described hereinabove.

We claim:

1. A placement system for placing a circuit component on a circuit board, said placement system comprising:
   a viewing system providing a single optical perspective via a split imaging system;
   a first stage, for positioning the circuit board onto which the component is to be placed within the field of view of said viewing system;
   a second stage, coupled to said first stage, for holding the circuit component, said second stage moveable in at least first and second different directions;
   a component pick-up system disposed about said first stage, said component pick-up system for picking up components from said second stage and placing the component in a predetermined position on said first stage wherein said viewing system is coaxially coupled to said component pick-up system;
   a monitor having a display screen, coupled to said viewing system, wherein said viewing system provides an image within a predetermined field of view on said monitor display screen; and
   a graphical user interface coupled to said monitor, said user interface for providing a position indicator on said monitor display screen, wherein said position indicator identifies the location of a particular feature of said circuit board.

2. The system of claim 1 wherein said component pick-up system comprises a vacuum tube.

3. The system of claim 2 wherein said position indicator identifies the position of a pad on the circuit board.

4. The system of claim 3 wherein said position indicator is a first one of a first plurality of symbols, each of said symbols indicating the position of a corresponding one of a second plurality of pads disposed on the circuit board.

5. The system of claim 4 wherein said position indicator is provided having a shape selected from the group consisting of:

a crosshair;

a square;

a rectangle;

a triangle;

a circle; and a moire pattern.

6. A method for placing a circuit component on a particular site of a circuit board, said method comprising the steps of:

a) positioning a circuit board at a first predetermined location generally within the field of view of a split imaging system providing a single optical perspective;

b) restricting the movement of the circuit board such that the circuit board is only able to move in one linear direction relative to the imaging system;

c) identifying the position of a particular feature of the circuit board with a position indicator;

d) displaying the position indicator on a graphical display;

e) positioning the circuit component at a second predetermined location within the field of view of the imaging system by manipulation of a component pick-up system, the split imaging system coaxially coupled to the component pick-up system; and f) aligning a feature of the circuit component with the position indicator displayed on the graphical display.

7. The method of claim 6 further comprising steps of:

verifying that the feature of the circuit component is aligned with the feature of the circuit board; and placing the circuit component on the placement site of the circuit board.

8. The method of claim 7 wherein:

the circuit board feature corresponds to a pad; and the circuit component feature corresponds to a lead.

9. The method of claim 8 wherein the step of identifying includes the step of using a graphical user interface to provide the position indicator on the graphical display.

10. A method for placing a circuit component on a particular site of a circuit board, said method comprising the steps of:

moving a first stage in at least one of first and second directions to position the circuit board at a first predetermined location generally within a field of view of a split imaging system coaxially coupled to said first stage and providing a single optical perspective;

b) restricting the movement of the first stage such that the circuit board is only able to move in a first one of said first and second directions;

c) marking, with a graphical position indicator, the locations of a particular feature of said circuit board;

d) displaying the graphical position indicator on a graphical display;

e) moving the first stage to a second predetermined position such that a circuit component is located at a second predetermined location within the field of view of the imaging system; and f) moving a second stage, said second stage coupled to said first stage, in at least one direction to align a feature of the circuit component with the graphical position indicator displayed on the graphical display.

11. The method of claim 10 further comprising steps of:

moving the first stage back to the first predetermined position such that the circuit component is aligned with said printed circuit board; and placing the circuit component at the placement site of the printed circuit board.

12. The method of claim 11 wherein before the step of placing the circuit component at the placement site of the printed circuit board the method further comprises the step of verifying that a particular feature of said circuit component is aligned with a particular feature of said circuit board.

13. The method of claim 12 further comprising the step of displaying a split image of the circuit board placement site on the graphical display and wherein the marking step includes marking at least one pads in the placement site.

14. The method of claim 13 further comprising the step of displaying a split image of the circuit component site on the graphical display and wherein a circuit component lead is aligned with the alignment indicators displayed on the graphical display.

* * * * *

UNITED STATES PATENT AND TRADEMARK OFFICE
CERTIFICATE OF CORRECTION

PATENT NO. : 5,627,913
DATED : May 6, 1997
INVENTOR(S) : Donald J. Spigarelli, et al.

It is certified that error appears in the above-identified patent and that said Letters Patent is hereby corrected as shown below:

Column 2, line 23, "system" should read --system.--.

Column 16, line 35, "which incorporated" should read --which is incorporated--.

Column 23, line 43, "by placing cross-hairs" should read --by placing cross hairs--.

Signed and Sealed this

Twenty-ninth Day of September, 1998

Attest:

BRUCE LEHMAN

Attesting Officer     Commissioner of Patents and Trademarks